United States Patent
Matsukawa et al.

(10) Patent No.: US 6,861,940 B2
(45) Date of Patent: Mar. 1, 2005

(54) MAGNETORESISTIVE ELEMENT

(75) Inventors: Nozomu Matsukawa, Nara (JP); Akihiro Odagawa, Tsuchiura (JP); Yasunari Sugita, Osaka (JP); Mitsuo Satomi, Katano (JP); Yoshio Kawashima, Neyagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/732,053

(22) Filed: Dec. 10, 2003

(65) Prior Publication Data

US 2004/0130431 A1 Jul. 8, 2004

Related U.S. Application Data

(63) Continuation of application No. PCT/JP03/05072, filed on Apr. 21, 2003.

(30) Foreign Application Priority Data

Apr. 24, 2002 (JP) .................................. 2002-123081

(51) Int. Cl.$^7$ ................................................ H01C 7/04
(52) U.S. Cl. ............................... 338/32 R; 360/124.12; 360/124.2
(58) Field of Search .................... 338/32 R; 360/324.12, 360/324.2

(56) References Cited

U.S. PATENT DOCUMENTS

| | | | | |
|---|---|---|---|---|
| 5,917,400 A | * | 6/1999 | Fujikata et al. | 338/32 R |
| 5,986,858 A | * | 11/1999 | Sato et al. | 360/324.2 |
| 6,114,850 A | * | 9/2000 | Hayashi | 324/252 |
| 6,198,601 B1 | * | 3/2001 | Hira et al. | 360/235.9 |
| 6,198,610 B1 | * | 3/2001 | Kawawake et al. | 360/324.12 |
| 6,347,049 B1 | * | 2/2002 | Childress et al. | 365/173 |
| 6,392,281 B1 | * | 5/2002 | Tsuge | 257/421 |

(List continued on next page.)

FOREIGN PATENT DOCUMENTS

| | | |
|---|---|---|
| EP | 1 191 344 | 3/2002 |
| JP | 8-241506 | 9/1996 |
| JP | 2001-068757 | 3/2001 |
| JP | 2003-086865 | 3/2003 |
| JP | 2003-152243 | 5/2003 |

OTHER PUBLICATIONS

"40% tunneling magnetoresistance after anneal at 380° C for tunnel junctions with iron–oxide interface layers", Journal of Applied Physics, vol. 89, No. 11, pp 6665 Jun. 1, 2001, Zhang et al.

"Characteristics of Annealed Dual Spin–valve Type Ferromagnetic Double Tunnel Junctions", Journal of the Magnetics Society of Japan vol. 25, No. 4–2, pp 775–778 (2001), Amano et al.

Documents of 116th Symposium of the Magnetics Society of Japan, pp 16.

Documents of 112th Symposium of the Magnetics of Society of Japan, pp 41.

*Primary Examiner*—Karl D. Easthom
(74) *Attorney, Agent, or Firm*—Merchant & Gould P.C.

(57) ABSTRACT

A magnetoresistive element of the present invention includes a multilayer structure that includes a non-magnetic layer (3) and a pair of ferromagnetic layers (1, 2) stacked on both sides of the non-magnetic layer (3). A resistance value differs depending on a relative angle between the magnetization directions of the ferromagnetic layers (1, 2) at the interfaces with the non-magnetic layer (3). The composition of at least one of the ferromagnetic layers (1, 2) in a range of 2 nm from the interface with the non-magnetic layer (3) is expressed by $(M_xO_y)_{1-z}Z_z$, where Z is at least one element selected from the group consisting of Ru, Os, Rh, Ir, Pd, Pt, Cu, Ag, and Au, M is at least one element selected from the group consisting of elements other than Z and O and includes a ferromagnetic metal, and x, y, and z satisfy $0.33 < y/x < 1.33$, $0 < x$, $0 < y$, and $0 \leq z \leq 0.4$. This magnetoresistive element can have excellent heat resistance and magnetoresistance characteristics.

10 Claims, 4 Drawing Sheets

U.S. PATENT DOCUMENTS

| | | | |
|---|---|---|---|
| 6,437,950 B1 * | 8/2002 | Chau et al. | 360/324.11 |
| 6,473,278 B1 * | 10/2002 | Gill | 360/324.12 |
| 6,538,859 B1 * | 3/2003 | Gill | 360/324.12 |
| 6,562,486 B2 * | 5/2003 | Sakakima et al. | 428/692 |
| 6,636,389 B2 * | 10/2003 | Gill | 360/314 |
| 6,661,626 B2 * | 12/2003 | Gill | 360/324.2 |
| 6,693,775 B1 * | 2/2004 | Gill | 360/324.11 |
| 6,693,776 B2 * | 2/2004 | Gill | 360/324.12 |
| 6,700,753 B2 * | 3/2004 | Singleton et al. | 360/324.1 |
| 2002/0126428 A1 * | 9/2002 | Gill | 360/324.12 |
| 2003/0002229 A1 * | 1/2003 | Pinarbasi | 360/324.2 |
| 2003/0053266 A1 | 3/2003 | Dieny et al. | |

* cited by examiner

MAGNETORESISTIVE ELEMENT

BACKGROUND OF THE INVENTION

1. Field of the Invention

The present invention relates to a magnetoresistive element.

2. Description of the Related Art

A multilayer film with a basic configuration of ferromagnetic layer/non-magnetic layer/ferromagnetic layer is known to provide a magnetoresistance effect (MR effect) by allowing a current to flow across the non-magnetic layer that is an intermediate layer. The MR effect depends on the magnitude of a relative angle between the magnetization directions of the ferromagnetic layers sandwiching the non-magnetic layer. A magnetoresistive element (MR element) that includes a non-magnetic layer made of an insulating material is referred to as a TMR element. An MR element that includes a non-magnetic layer made of a conductive material (e.g., Cu) is referred to as a GMR element. Another type of GMR element allows a current to flow parallel to the plane of the lamination. The MR element can be used, e.g., in a magnetic head for a magnetic recording medium or a device such as a magnetic memory (MRAM).

There has been progress in miniaturization of the MR element to achieve a high-density magnetic head or MRAM, which in turn increases a demand for MR elements that can provide a larger rate of change in magnetoresistance (MR ratio) or higher output. For this purpose, it is important to control the composition of a multilayer film of the MR element on the order of nm. When the MR element is used in a device, particularly in MRAM or the like, a monolithic structure combining the MR element and a general Si semiconductor is essential in view of the cost and the degree of integration. This monolithic process involves heat treatment at high temperatures to remove wiring defects or the like. Therefore, the MR element is required to have excellent heat resistance. For example, the heat treatment to remove wiring defects of the Si semiconductor should be performed in a hydrogen atmosphere at a high temperature of 400° C. to 450° C.

However, the magnetoresistance characteristics (MR characteristics) of a conventional MR element are likely to be degraded under heat treatment at about 300° C. to 350° C. Even if the conventional MR element has high heat resistance, such degradation occurs at 300° C. to 380° C. or more (see, e.g., Journal of Applied Physics, vol. 89, No. 11, p6665, Journal of the Magnetics Society of Japan, vol. 25, No. 4-2, pp.775–778(2001), Amano et al., or the documents of the 116th Symposium of the Magnetics Society of Japan, p16).

To avoid the degradation of the MR characteristics by heat treatment, a method for incorporating MR elements after the formation of semiconductor elements has been proposed (see, e.g., the documents of the 112th Symposium of the Magnetics Society of Japan, p 41). In this method, however, wiring between the MR elements, wiring between the MR elements and the semiconductor elements, or wiring for applying a magnetic field to the MR elements should be formed after producing the MR elements. Therefore, if the heat treatment for removal of wiring defects is not performed, a wiring resistance may vary and thus degrade the reliability and stability of the elements.

Alternatively, the heat treatment temperature may be decreased so as not to degrade the MR characteristics of an MR element, while the output of the MR element may be increased, thereby suppressing wiring variations due to wiring defects. In this case, it is preferable to use the element that can provide as large an MR ratio as possible.

SUMMARY OF THE INVENTION

It is an object of the present invention to provide a magnetoresistive element with excellent heat resistance and MR characteristics.

In a magnetoresistive element of the present invention, the oxidation state and composition of a ferromagnetic layer in the vicinity of the interface between the ferromagnetic layer and a non-magnetic layer are controlled.

A magnetoresistive element of the present invention includes a multilayer structure that includes a non-magnetic layer and a pair of ferromagnetic layers stacked on both sides of the non-magnetic layer. A resistance value differs depending on a relative angle between the magnetization directions of the ferromagnetic layers at the interfaces with the non-magnetic layer. The composition of at least one of the ferromagnetic layers in a range of 2 nm from the interface with the non-magnetic layer is expressed by $(M_xO_y)_{1-z}Z_z$. In this case, Z is at least one element selected from the group consisting of Ru, Os, Rh, Ir, Pd, Pt, Cu, Ag, and Au, M is at least one element selected from the group consisting of elements other than Z and O and includes a ferromagnetic metal, and x, y, and z satisfy the following formulas: $0.33<y/x<1.33$, $0<x$, $0<y$, and $0 \leq z \leq 0.4$.

A magnetoresistive element of the present invention includes a multilayer structure that includes a non-magnetic layer and a pair of ferromagnetic layers stacked on both sides of the non-magnetic layer. A resistance value differs depending on a relative angle between the magnetization directions of the ferromagnetic layers at the interfaces with the non-magnetic layer. The composition of at least one of the ferromagnetic layers in a range of 6 nm from the interface with the non-magnetic layer is expressed by $(M_{x'}O_{y'})_{1-z'}Z_{z'}$. In this case, Z and M are the same as those described above, and x', y', and z' satisfy the following formulas: $0<y'/x'<1.33$, $0<x'$, $0<y'$, and $0 \leq z' \leq 0.4$.

In the magnetoresistive element of the present invention, the composition of at least one of the ferromagnetic layers in a range of 2 nm from the interface with the non-magnetic layer may be expressed by the above formula $(M_{x'}O_{y'})_{1-z'}Z_{z'}$.

As described above, the oxidation state and composition of at least one of the ferromagnetic layers in the vicinity of the interface with the non-magnetic layer are controlled, so that the MR element can have excellent heat resistance and MR characteristics.

In the magnetoresistive element of the present invention, z may satisfy z>0. Moreover, in the magnetoresistive element of the present invention, z' may satisfy z'>0.

In the magnetoresistive elements of the present invention, M may include Fe.

In the magnetoresistive elements of the present invention, M may be expressed by $Fe_pCo_qNi_r$ where p, q, and r satisfy the following formulas: $p+q+r=1$, $0.47 \leq p \leq 1$, $0 \leq q \leq 0.4$, and $0 \leq r \leq 0.4$.

In the magnetoresistive elements of the present invention, p may satisfy p>0.5.

In the magnetoresistive elements of the present invention, M may be expressed by $Fe_aX^1_bX^2_c$ where $X^1$ is at least one element selected from the group consisting of Co, Ni, Mn, Tc, Re, Zn, Cd, Hg, Be, Mg, Ca, Sr, Ba, and Ra, $X^2$ is at least one element selected from the group consisting of Li, Na, K, Rb, Cs, and Fr, and a, b, and c satisfy the following formulas: $a+b+c=1$, $0.4<a\leq 1$, $0\leq b/a<0.5$, $0\leq c/a\leq 0.25$, and $0\leq (b+2c)/a<0.5$.

In the magnetoresistive elements of the present invention, M may be expressed by $Fe_a X^1_b X^2_c X^3_d X^4_e X^5_f$ where $X^1$ and $X^2$ are the same as those described above, $X^3$ is at least one element selected from the group consisting of Ti, Zr, Hf, V, Nb, Ta, Cr, Mo, W, Sc, Y, lanthanide, actinide, Al, Ga, In, and Tl, $X^4$ is at least one element selected from the group consisting of Si, Ge, Sn, Pb, As, Sb, and Bi, $X^5$ is at least one element selected from the group consisting of B, C, N, P, and S, and a, b, c, d, e, and f satisfy the following formulas: $a+b+c+d+e+f=1$, $0.4<a\leq 1$, $0\leq b/a<0.5$, $0\leq c/a\leq 0.25$, $0\leq (b+2c)/a<0.5$, $0\leq d$, $0\leq e$, $0\leq d+e\leq 0.3$, and $0\leq f<0.08$.

In the magnetoresistive elements of the present invention, a may satisfy $a>0.5$.

In the magnetoresistive elements of the present invention, the ferromagnetic layers may include a spinel-type compound. The spinel-type compound is included preferably in a range of 6 nm, and more preferably in a range of 2 nm, from the interfaces with the non-magnetic layer. The spinel-type compound is typified by a ferrite or magnetite ($Fe_3O_4$) obtained, e.g., by replacing Fe with a transition metal element or alkali metal element such as Mn, Zn, Ni, and Li.

The magnetoresistive elements of the present invention further may include an antiferromagnetic layer. By including the antiferromagnetic layer, the magnetoresistive elements can serve as a spin-valve MR element and have more excellent MR characteristics.

In the magnetoresistive elements of the present invention, the antiferromagnetic layer may include Mn. Specifically, the antiferromagnetic layer may include at least one metal selected from the group consisting of PtMn, PdPtMn, IrMn, FeMn, NiMn, and RhMn.

In the magnetoresistive elements of the present invention, a distance between the antiferromagnetic layer and the non-magnetic layer may be not less than 3 nm and not more than 50 nm.

The magnetoresistive elements of the present invention can be used as either a GMR element that includes a non-magnetic layer made of a conductive material or TMR element that includes a non-magnetic layer made of an insulating material.

The magnetoresistive elements of the present invention may be obtained by heat treatment at not less than 300° C. or not less than 350° C.

DESCRIPTION OF THE PREFERRED EMBODIMENTS

Figure 1:
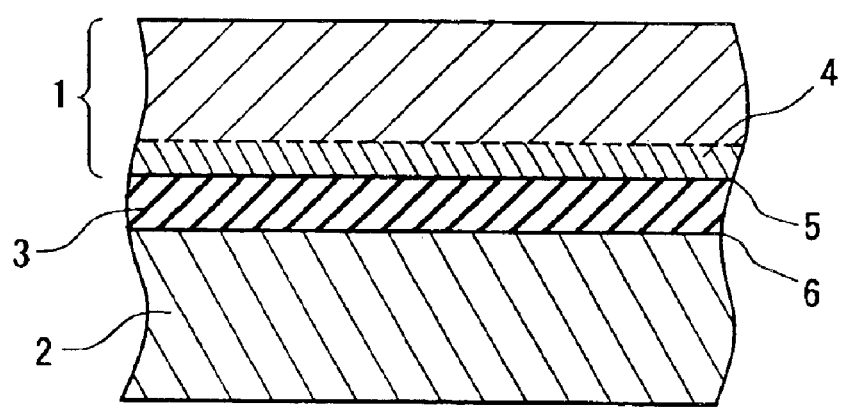
FIG. 1 is a schematic cross-sectional view showing an example of a magnetoresistive element of the present invention.

Hereinafter, embodiments of the present invention will be described with reference to the drawings. In the following embodiments, the identical elements are denoted by the same reference numerals, and the description may not be repeated.

First, the following is an explanation of an MR element of the present invention.

FIG. 1 is a schematic cross-sectional view showing an example of an MR element of the present invention. The MR element in FIG. 1 includes a multilayer structure that includes a non-magnetic layer 3 and a pair of ferromagnetic layers 1, 2 stacked on both sides of the non-magnetic layer 3. An interface 5 lies between the non-magnetic layer 3 and the ferromagnetic layer 1, and an interface 6 lies between the non-magnetic layer 3 and the ferromagnetic layer 2. The oxidation state and composition of the ferromagnetic layer in a range of 2 nm or 6 nm from at least one of the interfaces 5, 6 (e.g., a composition control portion 4 corresponding to the interface 5 in the example of FIG. 1) are controlled. The MR element including such a composition control portion can have excellent heat resistance and MR characteristics. Although FIG. 1 shows only the composition control portion 4 corresponding to the interface 5, a composition control portion corresponding to the interface 6 may be provided as well. The MR element of the present invention also may include two or more sets of the multilayer structures. In this case, at least one set may include the composition control portion.

The MR element of the present invention may include additional layers other than the non-magnetic layer and the ferromagnetic layers as needed. For example, an antiferromagnetic layer may be arranged in contact with one of the ferromagnetic layers, or a laminated structure (laminated ferrimagnetic structure) of magnetic film/non-magnetic film/magnetic film may be included in one of the ferromagnetic layers. In this case, the MR element can be formed as a spin-valve MR element. The spin-valve MR element can have more stable characteristics because of a larger difference between the ferromagnetic layer (free layer) whose magnetization direction changes with a relatively weak magnetic field and the ferromagnetic layer (pinned layer) whose magnetization direction does not change easily. For the spin-valve MR element, the composition control portion may be provided in either the pinned layer or the free layer.

When the MR element serves as a spin-valve MR element by including the antiferromagnetic layer, e.g., PtMn, PdPtMn, IrMn, FeMn, NiMn, RhMn, CrMnPt, or TbCo may be used for the antiferromagnetic layer. The thickness of the antiferromagnetic layer may be, e.g., 5 nm to 50 nm.

The non-magnetic film in the laminated ferrimagnetic structure may be formed, e.g., of Ru, Ir, or Rh. The thickness of the non-magnetic film may be, e.g., 0.4 nm to 2.6 nm. The magnetic films in the laminated ferrimagnetic structure may be films including, e.g., Ni, Fe, or Co. The thickness of the magnetic films may be, e.g., 2 nm to 10 nm.

The MR element of the present invention can be used as either a GMR element or a TMR element. For the GMR element, the non-magnetic layer is made of a conductive material. For the TMR element, the non-magnetic layer is made of an insulating material. The conductive material may be, e.g., a material including at least one element selected from the group consisting of Cu, Ag, Au, Cr, and Ru. The insulating material may be, e.g., a material including at least one compound selected from the group consisting of an oxide, a nitride, a carbide, an oxynitride, and a boride of at least one element selected from the group consisting of Al, Ta, Si, Mg, and Ge. In particular, a material including at least one compound selected from Al oxide, Al nitride, and Al oxynitride is preferred because these compounds are superior in insulating property.

The thickness of the non-magnetic layer made of the conductive material may be, e.g., 1.5 nm to 5.0 nm. The thickness of the non-magnetic layer made of the insulating material may be, e.g., 0.4 nm to 5.0 nm.

Next, the following is an explanation of a method for the film formation of an MR element of the present invention.

As a substrate of the element, a substrate with an insulated surface, e.g., a Si substrate with a thermally oxidized surface (Si substrate provided with a thermal oxide film), a quartz substrate, or a sapphire substrate can be used. A smoothing process such as chemical mechanical polishing (CMP) may be performed on the surface of the substrate as needed. A substrate on which a switching element such as a MOS transistor is formed also can be used as the substrate. In this case, e.g., an insulating layer may be formed on the switching element, and then contact holes may be provided in the necessary portions of the insulating layer.

Layers that constitute the element may be formed by general thin film formation methods such as sputtering, molecular beam epitaxy (MBE), CVD, pulse laser deposition, and ion beam sputtering. Microfabrication or etching also may be performed as needed. For the microfabrication, general microfabrication techniques, e.g., photolithography using a contact mask or stepper, electron beam (EB) lithography, or focused ion beam (FIB) processing can be used. For the etching, general etching techniques, e.g., ion milling, reactive ion etching (RIE), or ion milling with inductively coupled plasma (ICP) can be used. Moreover, general methods such as CMP and precision lapping can be used for smoothing or removing unnecessary portions of the films formed.

In the MR element of the present invention, after producing the element, heat treatment (e.g., at not less than 300° C.) for improving the characteristics of the element may be performed as needed. The heat treatment may be performed, e.g., in a vacuum, an inert gas, or hydrogen while either applying or not applying a magnetic field to the element. For example, when heat treatment in the presence of a magnetic field is required to pin the magnetization direction of a pinned layer, first heat treatment in the magnetic field (e.g., 260° C. to 300° C., $8 \times 10^4$ A/m to $2.4 \times 10^6$ A/m (1 kOe to 30 kOe)) may be performed, followed by second heat treatment. In the following examples, the MR element can exhibit favorable MR characteristics even if the second heat treatment is performed in the absence of a magnetic field. When the second heat treatment is performed while applying a magnetic field in the same direction as that of the magnetic field applied during the first heat treatment (i.e., heat treatment in the magnetic field), the MR element can exhibit more stable and favorable MR characteristics. Moreover, when the second heat treatment is performed in the absence of a magnetic field, further heat treatment is performed while applying a magnetic field in the same direction as that of the magnetic field applied during the first heat treatment (i.e., heat treatment in the magnetic field), so that the MR element can exhibit more stable and favorable MR characteristics.

As described above, the MR characteristics of a conventional MR element are likely to be constant or improved by heat treatment up to about 300° C., but to be degraded by heat treatment at 300° C. or more. Even if an MR element can maintain the MR characteristics during heat treatment up to about 350° C., the MR characteristics are likely to be degraded by heat treatment at 350° C. or more. In contrast, the MR element of the present invention can have favorable MR characteristics even after heat treatment at 300° C. to 350° C. or more (the specific examples will be described later in Examples). In other words, when heat treatment at not less than 300° C., particularly not less than 350° C. is performed, the effects of the present invention become prominent. For example, some processes for producing a Si semiconductor element involve heat treatment at about 400° C. Therefore, the use of the MR element of the present invention makes it possible to combine the film formation of the MR element with the production process of the Si semiconductor element. In this case, heat treatment at about 400° C. (for reducing wiring defects or contact resistances between the wirings and between the wirings and the element) in the production process of the Si semiconductor element may be performed at the same time as heat treatment at not less than 300° C. for improving the characteristics of the MR element. This can provide a complex of the MR element and the Si semiconductor at lower cost.

When the MR element of the present invention is subjected to heat treatment at 300° C. to 350° C. or more, there is a tendency not only to maintain the MR characteristics, but also to further improve the MR characteristics. Although the reason for this is not clarified, one possibility is that the heat treatment improves barrier characteristics of the non-magnetic layer. In general, the MR characteristics become better by reducing barrier defects or increasing a barrier height. For a conventional MR element, the effect of improving the MR characteristics resulting from such an improvement in barrier characteristics is considered to reach a certain value at about 300° C. For the MR element of the present invention, barrier defects may be reduced in the temperature range of not less than 300° C. due to a different reaction and mechanism from those in the temperature range of not more than 300° C. There is also another possibility that the heat treatment changes the state of a chemical bond at the interface between the non-magnetic layer and the ferromagnetic layer. Although this mechanism is not clarified at present, the MR characteristics of the MR element may be sensitive to the bonding state at the interface between the non-magnetic layer and the ferromagnetic layer.

There is also yet another possibility that the heat treatment at 300° C. to 350° C. or more allows the ferromagnetic layer in the vicinity of the interface with the non-magnetic layer to include a spinel-type compound typified by magnetite ($Fe_3O_4$) or the like. For example, the magnetite ($Fe_3O_4$), which is a kind of the spinel-type compound, is considered as so-called half metal having a spin polarization of 100%. An improvement in MR ratio of the MR element can be expected by increasing the spin polarization of the ferromagnetic layer in the vicinity of the interface with the non-magnetic layer.

The spinel-type compound (e.g., a spinel-type compound containing at least one element selected from Fe, Co, and Ni) is produced generally at a high temperature of not less than 1200° C. To produce, e.g., $Fe_3O_4$ at temperatures ranging from room temperature to about 500° C., the oxygen partial pressure within a diffusion length should be extremely low (e.g., $10^{-15}$ to $10^{-25}$ Pa or less ($10^{-20}$ to $10^{-30}$ atm or less)). The state of extremely low oxygen partial pressure requires that a metal such as Fe (Co, Ni) should coexist with a spinel-type compound such as $Fe_3O_4$, i.e., an O/M ratio should be not more than 1.33 within the diffusion length in a region where $Fe_3O_4$ or the like is to be produced. Even if the composition is controlled in the range of a distance longer than the diffusion length, hematite ($Fe_2O_3$) or the like may be generated, e.g., by a local variation in oxygen partial pressure within the diffusion length. Moreover, the MR ratio may depend on the state of the ferromagnetic layer in the vicinity of the interface with the non-magnetic layer. Therefore, the composition and oxidation state of the ferromagnetic layer in the vicinity of the interface with the non-magnetic layer may be controlled to achieve an MR element with excellent heat resistance and MR characteristics.

In the temperature range of 300° C. to 350° C. or more, wustite (FeO) or the like may be generated when the oxygen partial pressure is extremely low. The generation of FeO may degrade the MR ratio. However, even if FeO and $Fe_3O_4$ coexist within a diffusion length of the interface between the ferromagnetic layer and the non-magnetic layer, the MR ratio can remain good as long as the ferromagnetic layer in the vicinity of the interface with the non-magnetic layer includes a spinel-type compound such as $Fe_3O_4$. For this reason, when the O/M ratio in the vicinity of the interface is more than 0.33, a large MR ratio can be obtained by heat treatment up to about 500° C. When the O/M ratio in the vicinity of the interface is more than 1.33, the MR ratio is degraded probably due to the generation of hematite.

There is also still another possibility as follows. In general, a compound containing metals such as Al, Ta, Si, Mg, and Ge or a semiconductor and elements such as O, N, C, and B is used for the non-magnetic layer. These metals or semiconductor react with O whether they form a compound with O or not. Therefore, when the O/M ratio in the vicinity of the interface is controlled within the range of the present invention, the amount of defects in a barrier may be reduced.

In the MR element of the present invention, M may be expressed by $Fe_a X^1_b X^2_c$ where $X^1$ is at least one element selected from the group consisting of Co, Ni, Mn, Tc, Re, Zn, Cd, Hg, Be, Mg, Ca, Sr, Ba, and Ra, $X^2$ is at least one element selected from the group consisting of Li, Na, K, Rb, Cs, and Fr, and a, b, and c satisfy the following formulas: a+b+c=1, $0.4 < a \leq 1$, $0 \leq b/a \leq 0.5$, $0 \leq c/a \leq 0.25$, and $0 \leq (b+2c)/a < 0.5$. This MR element stably can have a larger MR ratio. In particular, when a, i.e., a value that reflects the amount of Fe, is more than 0.5, the MR element can have an even larger MR ratio.

A spinel-type compound consists of a divalent metal ion, two trivalent metal ions, and four oxygen atoms. To produce, e.g., $Fe_3O_4$ from $Fe_2O_3$, the trivalent ion should be reduced to the divalent ion. Therefore, the conditions of a low oxygen partial pressure and high temperatures are necessary to produce the spinel-type compound. In this case, however, a phase region for producing the spinel-type compound may be expanded to cover the range of lower temperature and higher oxygen partial pressure by the addition of a metal that tends to form a divalent ion (e.g., Co, Ni, Mn, Tc, Re, Zn, Cd, Hg, Be, Mg, Ca, Sr, Ba, or Ra) and an element that forms a monovalent ion (e.g., Li, Na, K, Rb, Cs, or Fr). Therefore, compared with the conditions for production of the MR element (e.g., a heat treatment temperature), the MR element can have excellent MR characteristics under broader conditions. When the ratios (b, c) of the metal that tends to form a divalent ion and the element that forms a monovalent ion are too large, a different compound from the spinel-type compound may be generated and degrade the MR characteristics.

In the MR element of the present invention, M may be expressed by $Fe_a X^1_b X^2_c X^3_d X^4_e X^5_f$ where $X^1$ is at least one element selected from the group consisting of Co, Ni, Mn, Tc, Re, Zn, Cd, Hg, Be, Mg, Ca, Sr, Ba, and Ra, $X^2$ is at least one element selected from the group consisting of Li, Na, K, Rb, Cs, and Fr, $X^3$ is at least one element selected from the group consisting of Ti, Zr, Hf, V, Nb, Ta, Cr, Mo, W, Sc, Y, lanthanide, actinide, Al, Ga, In, and Tl, $X^4$ is at least one element selected from the group consisting of Si, Ge, Sn, Pb, As, Sb, and Bi, $X^5$ is at least one element selected from the group consisting of B, C, N, P, and S, and a, b, c, d, e, and f satisfy the following formulas: a+b+c+d+e+f=1, $0.4 < a \leq 1$, $0 \leq b/a < 0.5$, $0 \leq c/a \leq 0.25$, $0 \leq (b+2c)/a < 0.5$, $0 \leq d$, $0 \leq e$, $0 \leq d+e \leq 0.3$, and $0 \leq f < 0.08$. This MR element can improve the general magnetic properties such as soft magnetic property and high-frequency property while maintaining the MR characteristics.

Elements such as Ti, Zr, Hf, V, Nb, Ta, Cr, Mo, W, Sc, Y, lanthanide, actinide, Al, Ga, In, and Tl may serve as divalent, trivalent, or tetravalent ions and dissolve in the spinel-type compound of Fe or the like to form a solid solution, thereby improving the general magnetic properties of the MR element. The above elements are nonmagnetic. Therefore, when the ratio (d) of the elements is too large, the ferromagnetic transition temperature is excessively low, or the ferromagnetic layer in the vicinity of the interface with the non-magnetic layer becomes paramagnetic or antiferromagnetic, so that the MR characteristics may be degraded.

Elements such as Si, Ge, Sn, Pb, As, Sb, and Bi or elements such as B, C, N, P, and S may dissolve slightly in the spinel-type compound to form a solid solution or precipitate in a grain boundary, thereby controlling the state of crystal grains in the vicinity of the interface with the non-magnetic layer and improving the general magnetic properties of the MR element. The above elements also are nonmagnetic. Therefore, when the ratios (e, f) of the elements are too large, the MR characteristics may be degraded.

In the MR element of the present invention, when at least one element selected from the group consisting of Ru, Os, Rh, Ir, Pd, Pt, Cu, Ag, and Au is used as Z, a large MR ratio can be obtained even in a higher temperature range, and thus the MR element can have more excellent heat resistance. In this case, the free energy for forming a compound of the above elements and oxygen is considered to be smaller than the free energy for forming a compound of elements other than the above elements and oxygen. Therefore, the composition ratio dependence is different from that of M (the ratio of M to oxygen is controlled in the present invention).

The improvement in heat resistance of the MR element with Z is attributed to the following possibility. Noble metals such as Ru, Os, Rh, Ir, Pd, Pt, Cu, Ag, and Au act as an oxidation-reduction catalyst and may accelerate a reaction of $Fe_2O_3 \rightarrow Fe_3O_4$ or suppress a reaction of $Fe_3O_4 \rightarrow FeO$. In particular, the use of an oxidation catalyst, e.g., Pt, Ir, or Rh may suppress the reaction of $Fe_3O_4 \rightarrow FeO$, so that the MR element can maintain stable MR characteristics even after heat treatment at 350° C. or more.

As described above, a spinel-type compound such as $Fe_3O_4$ is produced by controlling the element ratio or the oxygen partial pressure within a diffusion length. However, another method such as the application of energy also can be used. For example, energy may be applied in the form of plasma, light, or ion beam during or after the film formation of the MR element. In particular, a method for applying energy by heat treatment at 300° C. or more is simple as well as easy to perform simultaneously with other processes. Therefore, this method is effective in improving the productivity of the element.

When a divalent ion is added to obtain a larger MR ratio, Mn may be used as a metal to form the divalent ion, and an antiferromagnetic layer of, e.g., PtMn, PdPtMn, IrMn, FeMn, NiMn, or RhMn may be arranged in the MR element. Consequently, it is also possible to utilize the diffusion of Mn from the antiferromagnetic layer that is caused by heat treatment. To control the diffusion amount of Mn within the above range at a heat treatment temperature of about 300° C. to 450° C., a distance between the antiferromagnetic layer and the non-magnetic layer may be, e.g., 3 nm to 50 nm. The diffusion amount of Mn can be adjusted, e.g., by controlling heat treatment time.

The more uniform the composition and the state of crystal grains of the ferromagnetic layer in the vicinity of the interface with the non-magnetic layer become, the more likely the MR element is to be superior in stability of the MR characteristics even after long-time heat treatment. This will be described in the following examples.

EXAMPLES

Hereinafter, the present invention will be described in more detail by way of examples. However, the present invention is not limited to the following examples.

First, a method for evaluating an MR element of the examples will be described.

In the examples, the MR characteristics were evaluated by measuring the MR ratio of each sample. The MR ratio was measured in such a manner that after film formation, an element was incorporated into an evaluation MR element unit, and then a magnetic resistance of the element was measured (at room temperature in the presence of a magnetic field) using a direct-current four-terminal method. The magnetic field strength during measurement was $4.0 \times 10^5$ A/m (5 kOe) maximum. After measuring the MR ratio, some samples were heat-treated in the absence of a magnetic field at different temperatures of 300° C., 350° C., 400° C., and 450° C., and again the MR ratio was measured to evaluate the dependence of MR characteristics on heat treatment temperature (i.e., the heat resistance of the element).

The MR ratio was defined by $$MR \text{ ratio}(\%) = (R_{max} - R_{min})/R_{min} \times 100 \quad (1)$$

where $R_{max}$ represents an electrical resistance of the MR element caused when the magnetization directions of a pair of ferromagnetic layers sandwiching a non-magnetic layer are antiparallel to each other, and $R_{min}$ represents an electrical resistance of the MR element caused when the magnetization directions of the pair of ferromagnetic layers are parallel to each other.

Figure 2:
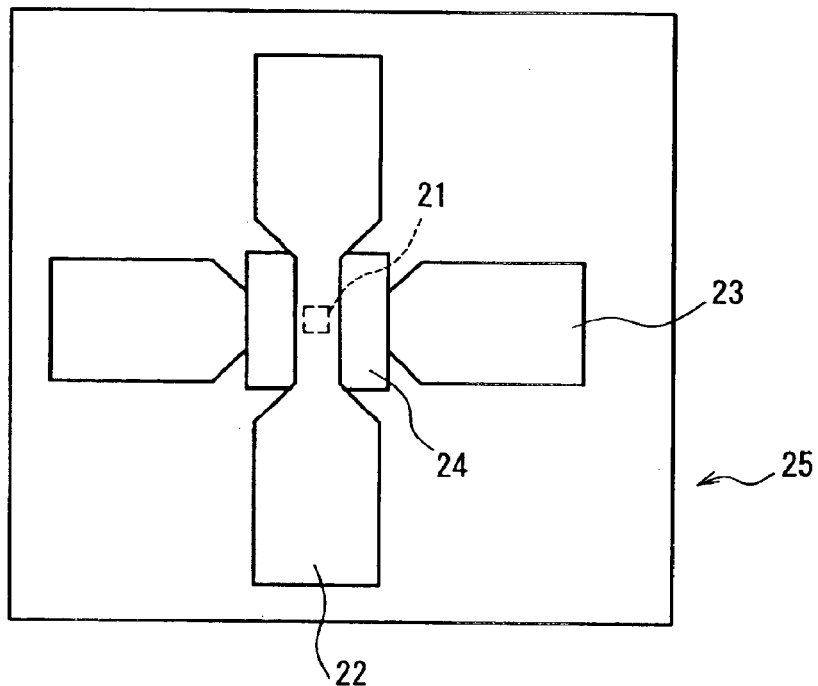
FIG. 2 is a schematic view showing an evaluation magnetoresistive element unit used in the examples.

FIG. 2 is a schematic diagram showing an evaluation MR element unit used in the examples. The evaluation MR element unit in FIG. 2 includes an MR element 21 that is sandwiched between an upper electrode 22 and a lower electrode 23. The whole structure is formed on a substrate 25. The upper electrode 22 and the lower electrode 23 are insulated by an interlayer insulating film 24. The MR ratio of the MR element 21 can be measured by allowing a current to flow between the electrodes while applying a magnetic field to the MR element 21. The MR element used in the examples has a size of 2 μm×2 μm to 30 μm×30 μm.

Figure 3:
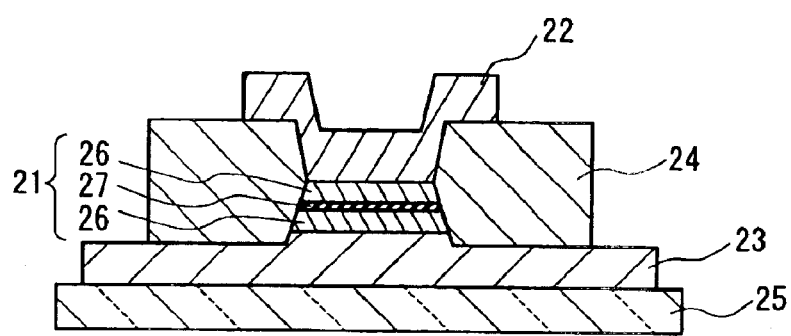
FIG. 3 is a cross-sectional view showing the structure of the evaluation magnetoresistive element unit used in the examples.

A method for producing the evaluation MR element unit will be described with reference to FIG. 3. FIG. 3 is a cross-sectional view of the evaluation MR element unit in FIG. 2, taken along a plane through the MR element 21.

First, a Si substrate provided with a thermal oxide film was used as the substrate 25. Then, the lower electrode 23 and the MR element 21 were formed on the substrate 25 in this order by RF magnetron sputtering and DC sputtering. A ferromagnetic layer 26 of the MR element 21 was formed in the presence of a magnetic field, so that magnetic anisotropy was imparted to the ferromagnetic layer 26. A non-magnetic layer 27 was made of an aluminum oxide, i.e., an insulating material. The non-magnetic layer 27 was formed as an aluminum oxide film (Al—O film: the composition ratio is not particularly limited) by depositing Al and heating the surface of the Al film with a lamp (up to about 200° C.) in an atmosphere containing oxygen. Subsequently, the MR element 21 was microfabricated to a predetermined size and shape using patterning by photolithography and etching by ion milling. Finally, Cu was deposited as the upper electrode 22, and $SiO_2$ was deposited as the interlayer insulating film 24. Thus, an evaluation MR element unit was produced.

In all samples of the examples, the composition of the ferromagnetic layer in the depth direction in the vicinity of the interface with the non-magnetic layer was analyzed after measuring the MR ratio. The composition analysis was performed, e.g., by using a transmission electron microscope (TEM), Auger electron spectroscopy (AES), or X-ray photoelectron spectroscopy (XPS). Moreover, secondary ion mass spectroscopy (SIMS) also was performed in the depth direction of the ferromagnetic layer while milling. The composition of the ferromagnetic layer located under the non-magnetic layer and on the substrate side was analyzed in the following manner. A model film was prepared so that the film formation was stopped after forming a non-magnetic layer. This model film was subjected to the same heat treatment as that of other samples, and only the non-magnetic layer was removed by milling so that the ferromagnetic layer was exposed for composition analysis.

Figure 4:
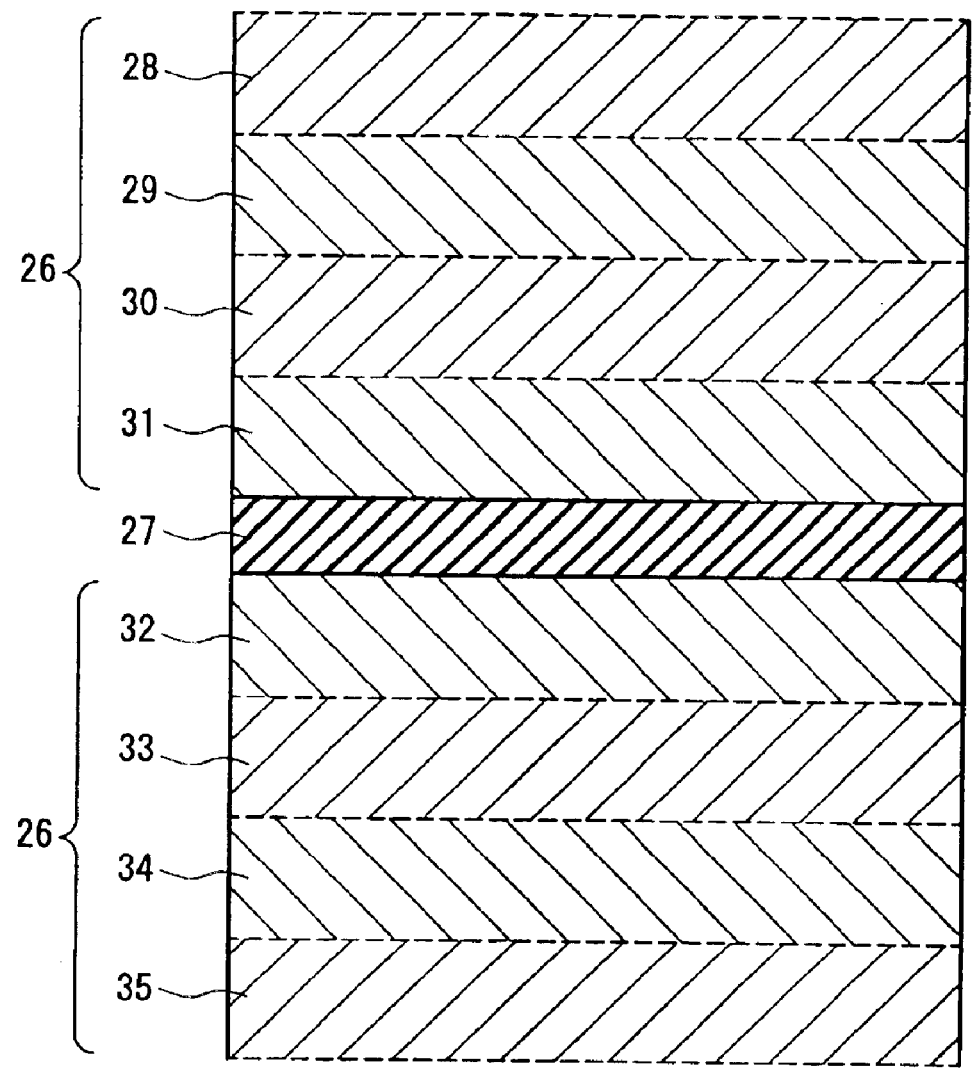
FIG. 4 is a cross-sectional view showing the region of a ferromagnetic layer for composition analysis in the examples.

To analyze the composition of the ferromagnetic layer, regions were set for every 2 nm of the ferromagnetic layer from the interface with the non-magnetic layer, and the composition of each of the regions was analyzed. FIG. 4 shows the regions used for composition analysis. As shown in FIG. 4, regions D31, C30, B29, and A28 were set for every 2 nm of the ferromagnetic layer 26 from the interface with the non-magnetic layer 27. Also, regions E32, F33, G34, and H35 were set in the same manner. In the regions A to H, the region H was arranged on the substrate side. That is, the composition in a range of 2 nm from the interface corresponds to the composition of the region D and/or the region E, and the composition in a range of 6 nm from the interface corresponds to the average composition of the regions B to D and/or the average composition of the regions E to G.

In this specification, an "interface" means the interface between the ferromagnetic layer and the non-magnetic layer, and an "O/M ratio" means the composition ratio of oxygen to the element M in the ferromagnetic layer unless otherwise noted. In the examples, when a material is expressed using a hyphen such as "Al—O", the composition ratio of the elements that constitute the material is not particularly limited.

Example 1

Using the above method, MR elements (samples 1 to 8) with the film configurations shown in Table 1 were prepared. The sample 1 was a conventional example. In Table 1, the figure in parentheses represents the thickness of each layer in nm, and the thickness is expressed in the same manner in the following. The thickness of an Al—O layer (non-magnetic layer) indicates the thickness of Al before oxidation. The same is true for the following examples.

TABLE 1

| Sample No. | Antiferro-magnetic layer | Ferromagnetic layer | Non-magnetic layer | Ferro-magnetic layer |
|---|---|---|---|---|
| 1 | Ir—Mn(20) | Co—Fe(2)/Fe(6) | Al—O(1) | Fe(6) |
| 2 | Ir—Mn(20) | Co—Fe(2)/Fe—O(6) | Al—O(1) | Fe—O(6) |
| 3 | Ir—Mn(20) | Co—Fe(2)/Fe—O(6) | Al—O(1) | Fe—O(6) |
| 4 | Ir—Mn(20) | Co—Fe(2)/Fe—O(6) | Al—O(1) | Fe—O(6) |
| 5 | Ir—Mn(20) | Co—Fe(2)/Fe—O(6) | Al—O(1) | Fe—O(6) |
| 6 | Ir—Mn(20) | Co—Fe(2)/Fe—O(6) | Al—O(1) | Fe—O(6) |
| 7 | Ir—Mn(20) | Co—Fe(2)/Fe—O(6) | Al—O(1) | Fe—O(6) |
| 8 | Ir—Mn(20) | Co—Fe(2)/Fe—O(6) | Al—O(1) | Fe—O(6) |

*Sample 1 is a conventional example.

In each sample, a Si substrate provided with a thermal oxide film was used as a substrate, and a laminate of Ta(3)/Cu(50)/Ta(3) was used as a lower electrode. The layers of each of the film configurations in Table 1 were stacked on the lower electrode in the order from left (i.e., the antiferromagnetic layer) to right, thus producing MR elements. In each sample, the Ir—Mn antiferromagnetic layer was arranged between the lower electrode and the ferromagnetic layer. One of the ferromagnetic layers sandwiching the non-magnetic layer, which was located on the substrate side, was a pinned layer, and the other was a free layer. Accordingly, the MR element of each sample was provided as a spin-valve MR element.

The Fe—O layer in contact with the non-magnetic layer was formed using an in situ oxidation method by changing the intensity of oxidation, so that the oxidation state of the Fe—O layer in the vicinity of the interface was controlled. Specifically, e.g., a ferromagnetic layer having a thickness of 0.5 nm to 2 nm (the layer including Fe in Example 1) was formed and oxidized in a pure oxygen atmosphere at temperatures ranging from room temperature to 200° C. and 13.3 Pa to 53 kPa (100 mTorr to 400 Torr). In this case, the intensity of oxidation of the ferromagnetic layer was increased by increasing the temperature and/or oxygen pressure. With this method, it was also possible to make a gradient in the oxidation state of the ferromagnetic layer in the thickness direction as needed by repeating the steps of film formation and oxidation. Moreover, the ferromagnetic layer located under the non-magnetic layer was coated with an Al layer that was thin enough not to completely prevent the oxidation of the ferromagnetic layer (e.g., not more than 0.5 nm). Then, using the in situ oxidation method, this ferromagnetic layer was oxidized more weakly than usual due to the Al layer.

Each of the samples 2 to 8 in Table 1 used the above method to form the Fe—O layer by changing the intensity of oxidation. In the following examples, the layers (other than the non-magnetic layer) including oxygen, such as the Fe—O layer, also were formed by the same method unless otherwise noted.

In Example 1, the MR ratio was measured without performing heat treatment after each sample was produced. Tables 2-1 and 2-2 show the measurements of MR ratio and composition analysis of each sample. The mark "—" in Table 2-1 means "unmeasured".

TABLE 2-1

| Sample No. | Composition ||||
| | Region A | Region B | Region C | Region D |
|---|---|---|---|---|
| 1 | — | Fe | Fe | Fe |
| 2 | — | $FeO_{0.3}$ | $FeO_{0.3}$ | $FeO_{0.3}$ |
| 3 | — | $FeO_{0.4}$ | $FeO_{0.4}$ | $FeO_{0.4}$ |
| 4 | — | $FeO_{0.7}$ | $FeO_{0.7}$ | $FeO_{0.7}$ |
| 5 | — | $FeO_{1.0}$ | $FeO_{1.0}$ | $FeO_{1.0}$ |
| 6 | — | $FeO_{1.3}$ | $FeO_{1.3}$ | $FeO_{1.3}$ |
| 7 | — | $FeO_{1.4}$ | $FeO_{1.4}$ | $FeO_{1.4}$ |
| 8 | — | $FeO_{1.6}$ | $FeO_{1.6}$ | $FeO_{1.6}$ |

*Sample 1 is a conventional example.

TABLE 2-2

| Sample No. | Composition |||| MR ratio |
| | Region E | Region F | Region G | Region H | (%) |
|---|---|---|---|---|---|
| 1 | Fe | Fe | Fe | $Co_{0.75}Fe_{0.25}$ | 10.1 |
| 2 | $FeO_{0.3}$ | $FeO_{0.3}$ | $FeO_{0.3}$ | $Co_{0.75}Fe_{0.25}$ | 12.1 |
| 3 | $FeO_{0.4}$ | $FeO_{0.4}$ | $FeO_{0.4}$ | $Co_{0.75}Fe_{0.25}$ | 13.1 |
| 4 | $FeO_{0.7}$ | $FeO_{0.7}$ | $FeO_{0.7}$ | $Co_{0.75}Fe_{0.25}$ | 13.2 |
| 5 | $FeO_{1.0}$ | $FeO_{1.0}$ | $FeO_{1.0}$ | $Co_{0.75}Fe_{0.25}$ | 13.1 |
| 6 | $FeO_{1.3}$ | $FeO_{1.3}$ | $FeO_{1.3}$ | $Co_{0.75}Fe_{0.25}$ | 13.5 |
| 7 | $FeO_{1.4}$ | $FeO_{1.4}$ | $FeO_{1.4}$ | $Co_{0.75}Fe_{0.25}$ | 8.8 |
| 8 | $FeO_{1.6}$ | $FeO_{1.6}$ | $FeO_{1.6}$ | $Co_{0.75}Fe_{0.25}$ | 1.2 |

*Sample 1 is a conventional example.

As shown in Tables 2-1 and 2-2, the MR ratios of the samples 2 to 6 were more improved than the sample 1. In each of the samples 2 to 6, the O/M ratios in both ranges of 2 nm (regions D, E) and 6 nm (regions B to D, E to G) from the interface were more than 0 and less than 1.33. In the sample 1, the O/M ratios in both ranges of 2 nm and 6 nm from the interface were zero. The samples 3 to 6, in which the O/M ratio in a range of 2 nm from the interface (regions D, E) was more than 0.33 and less than 1.33, particularly had a large MR ratio. In contrast, the samples 7, 8, in which the O/M ratios in both ranges of 6 nm and 2 nm from the interface were more than 1.33, showed a sharp decrease in MR ratio.

When an alloy with a composition expressed by $Fe_pCo_qNi_r$ (where $p+q+r=1$, $0.47 \leq p \leq 1$, $0 \leq q < 0.4$, and $0 \leq r \leq 0.4$) was used instead of Fe in the Fe—O layer, the same result was obtained. In this case, a particularly large MR ratio was obtained by satisfying $p > 0.5$.

When compositions such as $Fe_{0.50}Co_{0.50}$, $Fe_{0.75}Co_{0.25}$, $Fe_{0.50}Ni_{0.50}$, and $Fe_{0.50}Co_{0.025}Ni_{0.25}$ were used for the Co—Fe layer, the same result also was obtained.

When films such as $Al_2O_3$, AlN, TaO, and TaN produced, e.g., by reactive evaporation, plasma reaction, natural oxidation, or natural nitridation were used for the non-magnetic layer, the same result also was obtained.

Figure 5A:
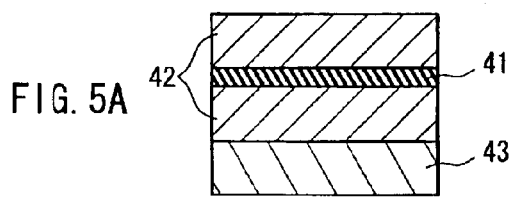
FIGS. 5A to 5H are schematic cross-sectional views showing an example of the film configuration of a magnetoresistive element of the present invention.
Figure 5E:
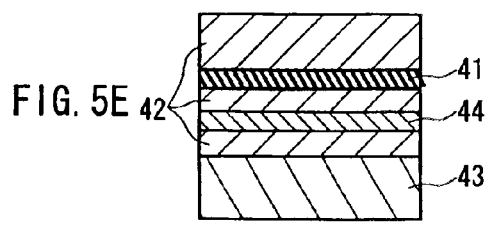
Figure 5B:
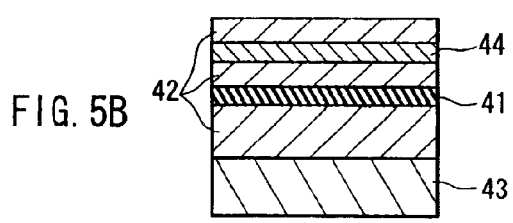
Figure 5F:
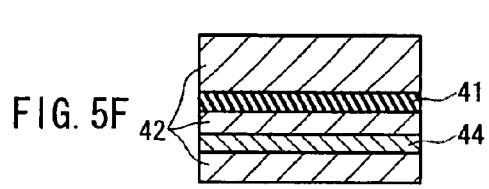
Figure 5C:
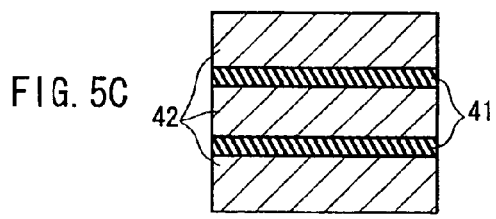
Figure 5G:
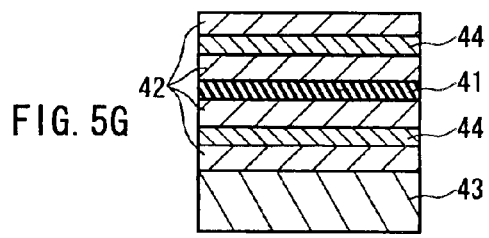
Figure 5D:
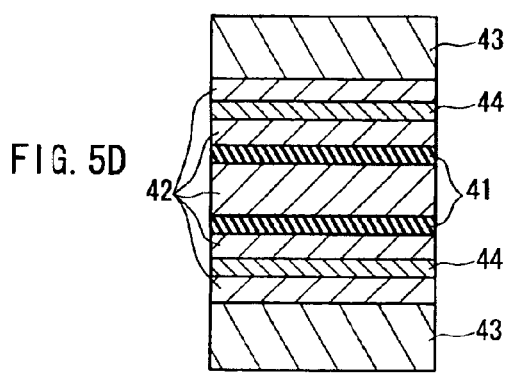
Figure 5H:
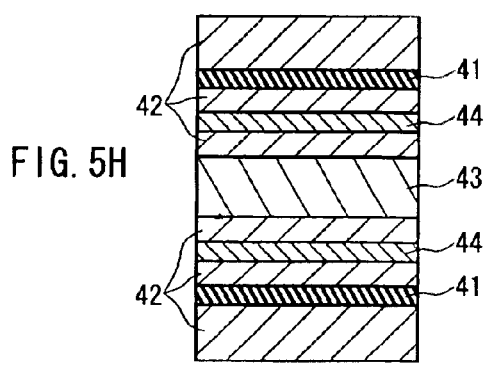

Moreover, any of the following elements (as shown in FIGS. 5A to 5H) also provided the same result by setting the above range of the O/M ratio for a region near the interface between a ferromagnetic layer 42 and a non-magnetic layer 41: an element including a plurality of non-magnetic layers 41, an element including a plurality of antiferromagnetic layers 43, or an element including a structure (laminated ferrimagnetic structure) in which a pair of ferromagnetic layers 42 were stacked via a non-magnetic film 44. For the element including a plurality of non-magnetic layers 41 as shown in FIGS. 5C, 5D, and 5H, the same result was obtained by setting the above range of the O/M ratio for a region near the interface of at least one of the ferromagnetic layers 42 in contact with the non-magnetic layers 41.

It was also possible to use plasma oxidation or ion beam oxidation for controlling the oxidation state of the ferromagnetic layer in the vicinity of the interface. However, the intensity of oxidation under the conditions of general plasma oxidation was too high for the oxidation state of the ferromagnetic layer in the vicinity of the interface to be controlled within the above range of the O/M ratio. Therefore, the ferromagnetic layer was not exposed directly to plasma or ion beam (e.g., it was exposed in such a manner that the ferromagnetic layer was oxidized by oxygen ions that bypassed a shield or the like, or by off-axis irradiation of the ion beam), so that the oxygen state of the ferromagnetic layer in the vicinity of the interface was controlled within the above range of the O/M ratio. When the ferromagnetic layer was oxidized by making the oxygen concentration much lower than that of the general plasma oxidation and then exposed to plasma for a very short time (e.g., not more than 60 seconds), the oxygen state of the ferromagnetic layer in the vicinity of the interface also was controlled within the above range of the O/M ratio.

Example 2

Using the same method as Example 1, MR elements (samples 9 to 18) with the film configurations shown in Table 3 were prepared. The sample 9 was a conventional example.

In each sample, a Si substrate provided with a thermal oxide film was used as a substrate, and a laminate of Ta(3)/Cu(50)/Ta(3) was used as a lower electrode. The layers of each of the film configurations in Table 3 were stacked on the lower electrode in the order from left to right, thus producing MR elements. In each sample, the Pt—Co antiferromagnetic layer was arranged between the lower electrode and the ferromagnetic layer. Accordingly, the MR element of each sample was provided as a spin-valve MR element.

In Table 3, when the MR element includes a plurality of Fe—O layers as shown in the sample 12, the Fe—O layers differ from each other in oxidation state.

After film formation, the samples 9 to 18 were heat-treated in the absence of a magnetic field at different temperatures of 300° C., 350° C., 400° C., and 450° C. for 30 minutes. Then, the temperature was reduced to room temperature, and the MR ratio was measured.

Table 4 shows the measurements of MR ratio and composition analysis of each sample. In this example, the composition of only one of the ferromagnetic layers sandwiching the non-magnetic layer (the ferromagnetic layer located on the substrate side: regions E to H) was analyzed.

TABLE 3

| Sample No. | Antiferromagnetic layer | Ferromagnetic layer | Non-magnetic layer | Ferromagnetic layer |
|---|---|---|---|---|
| 9  | Pt—Co(20) | Co—Fe(2)/Fe(6) | Al—O(1) | Ni—Fe(8) |
| 10 | Pt—Co(20) | Co—Fe(2)/Fe(4)/Fe—O(2) | Al—O(1) | Ni—Fe(8) |
| 11 | Pt—Co(20) | Co—Fe(2)/Fe(4)/Fe—O(2) | Al—O(1) | Ni—Fe(8) |
| 12 | Pt—Co(20) | Co—Fe(2)/Fe—O(2)/Fe—O(4) | Al—O(1) | Ni—Fe(8) |
| 13 | Pt—Co(20) | Co—Fe(2)/Fe(2)/Fe—O(2)/Fe(2) | Al—O(1) | Ni—Fe(8) |
| 14 | Pt—Co(20) | Co—Fe(2)/Fe(2)/Fe—O(2)/Fe(2) | Al—O(1) | Ni—Fe(8) |
| 15 | Pt—Co(20) | Co—Fe(2)/Fe—O(1)/Fe—O(4)/Fe—O(1) | Al—O(1) | Ni—Fe(8) |
| 16 | Pt—Co(20) | Co—Fe(2)/Fe—O(2)/Fe(4) | Al—O(1) | Ni—Fe(8) |
| 17 | Pt—Co(20) | Co—Fe(2)/Fe—O(2)/Fe(4) | Al—O(1) | Ni—Fe(8) |
| 18 | Pt—Co(20) | Co—Fe(2)/Fe—O(4)/Fe(2) | Al—O(1) | Ni—Fe(8) |

*Sample 9 is a conventional example

TABLE 4

| Sample No. | Heat treatment temperature (° C.) | Composition | | | | MR ratio (%) |
|---|---|---|---|---|---|---|
| | | Region E | Region F | Region G | Region H | |
| 9 | 300 | Fe | Fe | Fe | $Co_{0.75}Fe_{0.25}$ | 11.1 |
| (Conventional | 350 | Fe | Fe | Fe | $Co_{0.75}Fe_{0.25}$ | 13.5 |
| example) | 400 | Fe | Fe | Fe | $Co_{0.75}Fe_{0.25}$ | 8.2 |
| | 450 | Fe | Fe | $Fe_{0.95}Co_{0.05}$ | $Co_{0.70}Fe_{0.30}$ | 0.9 |
| 10 | 300 | $FeO_{1.0}$ | Fe | Fe | $Co_{0.75}Fe_{0.25}$ | 13.3 |
| | 350 | $FeO_{0.7}$ | $FeO_{0.3}$ | Fe | $Co_{0.75}Fe_{0.25}$ | 21.1 |
| | 400 | $FeO_{0.5}$ | $FeO_{0.3}$ | $FeO_{0.1}$ | $Co_{0.75}Fe_{0.25}$ | 15.2 |
| | 450 | $FeO_{0.4}$ | $FeO_{0.3}$ | $Fe_{0.95}Co_{0.05}O_{0.2}$ | $Co_{0.70}Fe_{0.30}$ | 3.5 |
| 11 | 300 | $FeO_{1.6}$ | Fe | Fe | $Co_{0.75}Fe_{0.25}$ | 5.6 |
| | 350 | $FeO_{1.3}$ | $FeO_{0.3}$ | Fe | $Co_{0.75}Fe_{0.25}$ | 26.2 |
| | 400 | $FeO_{0.8}$ | $FeO_{0.5}$ | $FeO_{0.3}$ | $Co_{0.75}Fe_{0.25}$ | 18.1 |
| | 450 | $FeO_{0.6}$ | $FeO_{0.5}$ | $Fe_{0.95}Co_{0.05}O_{0.5}$ | $Co_{0.70}Fe_{0.30}$ | 8.9 |

TABLE 4-continued

| Sample No. | Heat treatment temperature (° C.) | Composition Region E | Region F | Region G | Region H | MR ratio (%) |
|---|---|---|---|---|---|---|
| 12 | 300 | $FeO_{1.6}$ | $FeO_{1.6}$ | $FeO_{1.0}$ | $Co_{0.75}Fe_{0.25}$ | 5.5 |
|  | 350 | $FeO_{1.6}$ | $FeO_{1.4}$ | $FeO_{1.2}$ | $Co_{0.75}Fe_{0.25}$ | 9.9 |
|  | 400 | $FeO_{1.5}$ | $FeO_{1.4}$ | $FeO_{1.3}$ | $Co_{0.75}Fe_{0.25}$ | 8.2 |
|  | 450 | $FeO_{1.4}$ | $FeO_{1.4}$ | $Fe_{0.95}Co_{0.05}O_{1.4}$ | $Co_{0.70}Fe_{0.30}$ | 0.8 |
| 13 | 300 | Fe | $FeO_{1.0}$ | Fe | $Co_{0.75}Fe_{0.25}$ | 11.4 |
|  | 350 | $FeO_{0.2}$ | $FeO_{0.6}$ | $FeO_{0.2}$ | $Co_{0.75}Fe_{0.25}$ | 16.9 |
|  | 400 | $FeO_{0.3}$ | $FeO_{0.4}$ | $FeO_{0.3}$ | $Co_{0.75}Fe_{0.25}$ | 12.2 |
|  | 450 | $FeO_{0.4}$ | $FeO_{0.3}$ | $Fe_{0.95}Co_{0.05}O_{0.3}$ | $Co_{0.70}Fe_{0.30}$ | 3.9 |
| 14 | 300 | Fe | $FeO_{1.6}$ | Fe | $Co_{0.75}Fe_{0.25}$ | 10.9 |
|  | 350 | $FeO_{0.2}$ | $FeO_{1.2}$ | $FeO_{0.2}$ | $Co_{0.75}Fe_{0.25}$ | 17 |
|  | 400 | $FeO_{0.4}$ | $FeO_{0.9}$ | $FeO_{0.4}$ | $Co_{0.75}Fe_{0.25}$ | 13.3 |
|  | 450 | $FeO_{0.6}$ | $FeO_{0.6}$ | $Fe_{0.95}Co_{0.05}O_{0.5}$ | $Co_{0.70}Fe_{0.30}$ | 8.8 |
| 15 | 300 | $FeO_{1.3}$ | $FeO_{1.6}$ | $FeO_{1.3}$ | $Co_{0.75}Fe_{0.25}$ | 15.5 |
|  | 350 | $FeO_{1.4}$ | $FeO_{1.5}$ | $FeO_{1.3}$ | $Co_{0.75}Fe_{0.25}$ | 10.4 |
|  | 400 | $FeO_{1.4}$ | $FeO_{1.5}$ | $FeO_{1.4}$ | $Co_{0.75}Fe_{0.25}$ | 8.5 |
|  | 450 | $FeO_{1.4}$ | $FeO_{1.4}$ | $Fe_{0.95}Co_{0.05}O_{1.4}$ | $Co_{0.70}Fe_{0.30}$ | 0.8 |
| 16 | 300 | Fe | Fe | $FeO_{1.0}$ | $Co_{0.75}Fe_{0.25}$ | 10.7 |
|  | 350 | $FeO_{0.1}$ | $FeO_{0.2}$ | $FeO_{0.7}$ | $Co_{0.75}Fe_{0.25}$ | 14.9 |
|  | 400 | $FeO_{0.3}$ | $FeO_{0.3}$ | $FeO_{0.5}$ | $Co_{0.75}Fe_{0.25}$ | 12.4 |
|  | 450 | $FeO_{0.4}$ | $FeO_{0.3}$ | $Fe_{0.95}Co_{0.05}O_{0.3}$ | $Co_{0.70}Fe_{0.30}$ | 4.2 |
| 17 | 300 | Fe | Fe | $FeO_{1.6}$ | $Co_{0.75}Fe_{0.25}$ | 11.3 |
|  | 350 | $FeO_{0.1}$ | $FeO_{0.3}$ | $FeO_{1.2}$ | $Co_{0.75}Fe_{0.25}$ | 15.4 |
|  | 400 | $FeO_{0.3}$ | $FeO_{0.5}$ | $FeO_{0.9}$ | $Co_{0.75}Fe_{0.25}$ | 12.6 |
|  | 450 | $FeO_{0.5}$ | $FeO_{0.6}$ | $Fe_{0.95}Co_{0.05}O_{0.5}$ | $Co_{0.70}Fe_{0.30}$ | 6.5 |
| 18 | 300 | $FeO_{1.0}$ | $FeO_{1.6}$ | $FeO_{1.6}$ | $Co_{0.75}Fe_{0.25}$ | 14.1 |
|  | 350 | $FeO_{1.2}$ | $FeO_{1.4}$ | $FeO_{1.6}$ | $Co_{0.75}Fe_{0.25}$ | 23.8 |
|  | 400 | $FeO_{1.3}$ | $FeO_{1.4}$ | $FeO_{1.5}$ | $Co_{0.75}Fe_{0.25}$ | 17.6 |
|  | 450 | $FeO_{1.4}$ | $FeO_{1.4}$ | $Fe_{0.95}Co_{0.05}O_{1.4}$ | $Co_{0.70}Fe_{0.30}$ | 1.1 |

With the same heat treatment temperature, as shown in Table 4, when the O/M ratios in both ranges of 2 nm and 6 nm from the interface were more than 0 and less than 1.33, the MR ratios of the samples were more increased than those of sample 9. In the sample 9, the O/M ratios in both ranges of 2 nm and 6 nm from the interface were zero. The samples in which the O/M ratio in a range of 2 nm from the interface was more than 0.33 and less than 1.33 had a particularly large MR ratio. Even if the O/M ratio in a range of 6 nm from the interface was more than 0 and less than 1.33, the MR ratio was decreased as compared with the conventional example when the O/M ratio in a range of 2 nm from the interface was not less than 1.33 (e.g., the sample 11 at a heat treatment temperature of 300° C.).

For the samples in which the O/M ratio in a range of 6 nm from the interface was not less than 1.33, the MR ratio was improved significantly when the O/M ratio in a range of 2 nm from the interface was more than 0.33 and less than 1.33 (e.g., the sample 15 at a heat treatment temperature of 300° C., the sample 18 at a heat treatment temperature of 300° C. to 400° C., or the like). For the sample 18 at a heat treatment temperature of 450° C., however, the O/M ratio in a range of 2 nm from the interface was not less than 1.33, and thus the MR ratio was decreased extremely.

In summary, the MR element had a large MR ratio when the O/M ratio in both ranges of 2 nm and 6 nm from the interface was more than 0 and less than 1.33 or when the O/M ratio in a range of 2 nm from the interface was more than 0.33 and less than 1.33. In particular, the effect of controlling the O/M ratio in a range of 2 nm from the interface was prominent.

A larger MR ratio also can be expected when the O/M ratio in a range of 6 nm from the interface is not less than 1.33 and the O/M ratio in a range of 2 nm from the interface is more than 0 and not more than 0.33. However, a sample that satisfies such conditions cannot be produced in the present invention.

Comparing the heat treatment temperature dependence of each sample shows that the MR ratio of the sample 9 is decreased significantly at a heat treatment temperature of not less than 300° C., particularly more than 350° C. Not only the sample 9 but also conventional MR elements usually start to decrease in MR ratio at a heat treatment temperature of not less than 300° C. Even if the conventional MR elements have heat resistance, the MR ratio is likely to be decreased by heat treatment at not less than 350° C.

In contrast, the MR ratio of an MR element of the present invention is less decreased, and in fact may be rather improved, so that the MR element has excellent resistance to heat treatment at not less than 300° C., particularly not less than 350° C. Therefore, the MR element of the present invention can exhibit higher stability in heat treatment at about 400° C., which usually is performed, e.g., in a Si semiconductor process. Moreover, it is possible to combine the MR element with the Si semiconductor process, thus contributing to cost reduction.

When the MR element of the present invention is subjected to heat treatment at 300° C. to 350° C. or more, there is often a tendency not only to maintain the MR ratio, but also to further improve the MR ratio. The reason for this is not clarified, but attributed to the following possibilities.

1. Controlling the oxidation state and composition of the ferromagnetic layer in the vicinity of the interface may reduce the amount of defects in the non-magnetic layer, so that barrier characteristics of the non-magnetic layer are improved.

The MR characteristics generally become better by reducing the amount of defects in the non-magnetic layer. When the non-magnetic layer is made of an insulating material, the MR characteristics become better by increasing a barrier height of the tunnel insulating layer. For a conventional MR element, the effect of improving the MR characteristics resulting from such an improvement in barrier characteristics is considered to reach a certain value at a heat treatment temperature of, e.g., about 300° C. For the MR element of the present invention, structural defects of the non-magnetic layer may be reduced even at a heat treatment temperature of, e.g., not less than 300° C. due to a different reaction and mechanism from those at a heat treatment temperature of not more than 300° C.

When the non-magnetic layer is made, e.g., of an insulating material, a compound containing metals (or a semiconductor) such as Al, Ta, Si, Mg, and Ge and elements such as O, N, C, and B generally can be used as the insulating material. These metals (semiconductor) easily react with O whether the compound is an oxide or not. Therefore, a mechanism for reducing the structural defects of the non-magnetic layer may be provided by controlling the oxidation state of the ferromagnetic layer in the vicinity of the interface.

2. Controlling the oxidation state and composition of the ferromagnetic layer in the vicinity of the interface may change the state of a chemical bond at the interface.

Although this mechanism is not clarified, the MR characteristics of the MR element may be affected considerably by the bonding state at the interface between the non-magnetic layer and the ferromagnetic layer.

3. Controlling the oxidation state and composition of the ferromagnetic layer in the vicinity of the interface may allow the ferromagnetic layer in the vicinity of the interface (e.g., the composition control portion 4 in FIG. 1) to include a spinel-type compound typified by magnetite ($Fe_3O_4$).

The spinel-type compound is considered a so-called half metal having a spin polarization of 100%. Therefore, when the spinel-type compound is present in the vicinity of the interface, the spin polarization of the ferromagnetic layer is increased, and thus the MR characteristics such as MR ratio also can be improved.

The spinel-type compound containing Fe (and/or Co, and/or Ni) is produced generally at a high temperature of not less than 1200° C. To produce the spinel-type compound, e.g., $Fe_3O_4$ in the vicinity of the interface at heat treatment temperatures ranging from room temperature to about 500° C., the oxygen partial pressure within a diffusion length of oxygen atoms from the interface should be extremely low (e.g., $10^{-15}$ to $10^{-25}$ Pa or less) at the heat treatment temperature and time.

The state of extremely low oxygen partial pressure requires that the oxidation state of the ferromagnetic layer within the diffusion length should be the coexistence of a Fe (and/or Co, and/or Ni) metal and a spinel-type compound such as $Fe_3O_4$. Since the O/M ratio of $Fe_3O_4$ is 1.33, the low oxygen partial pressure conditions can be satisfied if the O/M ratio of the ferromagnetic layer is less than 1.33. Considering the average diffusion length of oxygen atoms, it is necessary only that the O/M ratio of the ferromagnetic layer in a range of about 6 nm from the interface should be less than 1.33. Even if the oxidation state is controlled in the range of a distance larger than the diffusion length, hematite ($Fe_2O_3$) or the like that may degrade the MR characteristics is likely to be generated by a local variation in oxygen partial pressure.

The MR characteristics are considered to depend strongly on the ferromagnetic layer, particularly the portion closer to the interface with the non-magnetic layer. Therefore, the control of oxidation state in close proximity to the interface, i.e., in a range of about 2 nm from the interface is assumed to have a great influence. The results obtained in Example 2 may reflect these phenomena.

The lower limit (0.33) of the O/M ratio in a range of 2 nm from the interface may indicate that a spinel-type compound is present in a region located immediately near the interface of the ferromagnetic layer. When the O/M ratio is close to zero, the oxygen partial pressure becomes extremely low, and thus wustite (FeO) that may degrade the MR characteristics is likely to be generated partially.

Example 3

Using the same method as Examples 1 and 2, MR elements (samples 19 to 44) with the film configurations shown in Tables 5 and 6 were prepared. The sample 19 was a conventional example.

TABLE 5

| Sample No. | Antiferromagnetic layer | Ferromagnetic layer | Non-magnetic layer | Ferromagnetic layer |
|---|---|---|---|---|
| 19 | Fe—Mn(15) | Fe(6) | Al—O(1) | Fe(6) |
| 20 | Fe—Mn(15) | Fe—Mn(6) | Al—O(1) | Fe—Mn(6) |
| 21 | Fe—Mn(15) | Fe—O(6) | Al—O(1) | Fe—O(6) |
| 22 | Fe—Mn(15) | Fe—Mn—O(6) | Al—O(1) | Fe—Mn—O(6) |
| 23 | Fe—Mn(15) | Fe—Mn—O(6) | Al—O(1) | Fe—Mn—O(6) |
| 24 | Fe—Mn(15) | Fe—Mn—O(6) | Al—O(1) | Fe—Mn—O(6) |
| 25 | Fe—Mn(15) | Fe—Mn—O(6) | Al—O(1) | Fe—Mn—O(6) |
| 26 | Fe—Mn(15) | Fe—Co—Mn(6) | Al—O(1) | Fe—Co—Mn(6) |
| 27 | Fe—Mn(15) | Fe—Co—Mn—O(6) | Al—O(1) | Fe—Co—Mn—O(6) |
| 28 | Fe—Mn(15) | Fe—Co—Mn—O(6) | Al—O(1) | Fe—Co—Mn—O(6) |
| 29 | Fe—Mn(15) | Fe—Co—Mn—O(6) | Al—O(1) | Fe—Co—Mn—O(6) |
| 30 | Fe—Mn(15) | Fe—Co—Mn—O(6) | Al—O(1) | Fe—Co—Mn—O(6) |
| 31 | Fe—Mn(15) | Fe—Co—Mn—O(6) | Al—O(1) | Fe—Co—Mn—O(6) |
| 32 | Fe—Mn(15) | Co—Fe(4)/Fe—Co—Mn—O(2) | Al—O(1) | Fe—Co—Mn—O(2)/Ni—Fe(4) |

*Sample 19 is a conventional example.

TABLE 6

| Sample No. | Antiferromagnetic layer | Ferromagnetic layer | Non-magnetic layer | Ferromagnetic layer |
|---|---|---|---|---|
| 33 | Fe—Mn(15) | Fe—Li(6) | Al—O(1) | Fe—Li(6) |
| 34 | Fe—Mn(15) | Fe—Li—O(6) | Al—O(1) | Fe—Li—O(6) |
| 35 | Fe—Mn(15) | Fe—Li—O(6) | Al—O(1) | Fe—Li—O(6) |
| 36 | Fe—Mn(15) | Fe—Li—O(6) | Al—O(1) | Fe—Li—O(6) |
| 37 | Fe—Mn(15) | Fe—Li—O(6) | Al—O(1) | Fe—Li—O(6) |
| 38 | Fe—Mn(15) | Fe—Li—O(6) | Al—O(1) | Fe—Li—O(6) |
| 39 | Fe—Mn(15) | Fe—Li—O(6) | Al—O(1) | Fe—Li—O(6) |
| 40 | Fe—Mn(15) | Fe—Mn—Li(6) | Al—O(1) | Fe—Mn—Li(6) |
| 41 | Fe—Mn(15) | Fe—Mn—Li—O(6) | Al—O(1) | Fe—Mn—Li—O(6) |
| 42 | Fe—Mn(15) | Fe—Mn—Li—O(6) | Al—O(1) | Fe—Mn—Li—O(6) |
| 43 | Fe—Mn(15) | Fe—Mn—Li—O(6) | Al—O(1) | Fe—Mn—Li—O(6) |
| 44 | Fe—Mn(15) | Fe—Mn—Li—O(6) | Al—O(1) | Fe—Mn—Li—O(6) |

In each sample, a Si substrate provided with a thermal oxide film was used as a substrate, and a laminate of Ta(3)/Cu(50)/Ta(3) was used as a lower electrode. The layers of each of the film configurations in Tables 5 and 6 were stacked on the lower electrode in the order from left to right, thus producing MR elements. In each sample, the Fe—Mn antiferromagnetic layer was arranged between the lower electrode and the ferromagnetic layer. Accordingly, the MR element of each sample was provided as a spin-valve MR element.

The ferromagnetic layer in contact with the non-magnetic layer was formed by a reactive film formation method in which oxygen is added while the film is formed. This method was used to control the oxidation state of the ferromagnetic layer in the vicinity of the interface. The partial pressure of the added oxygen varied from $1.3 \times 10^{-3}$ Pa to 1.3 Pa (from $10^{-5}$ Torr to $10^{-2}$ Torr), and the film was oxidized more weakly than with general reactive sputtering.

After film formation, the samples 19 to 44 were heat-treated (at 260° C. for 2 hours) in a vacuum of $6.7 \times 10^{-5}$ Pa ($5.0 \times 10^{-7}$ Torr) or less while applying a magnetic field of $8.0 \times 10^6$ A/m (10 kOe), so that magnetic anisotropy was imparted to the ferromagnetic layer.

Tables 7-1, 7-2, 8-1, and 8-2 show the measurements of MR ratio and composition analysis of each sample. The mark "—" in Tables 7-1 and 8-1 means that the composition was not analyzed. In Example 3, the MR ratio was measured at room temperature without performing heat treatment after each sample was produced.

TABLE 7-1

| Sample No. | Composition | | | |
|---|---|---|---|---|
| | Region A | Region B | Region C | Region D |
| 19 | — | Fe | Fe | Fe |
| 20 | — | $Fe_{0.77}Mn_{0.23}$ | $Fe_{0.77}Mn_{0.23}$ | $Fe_{0.77}Mn_{0.23}$ |
| 21 | — | $FeO_{1.3}$ | $FeO_{1.3}$ | $FeO_{1.3}$ |
| 22 | — | $Fe_{0.83}Mn_{0.17}O_{1.1}$ | $Fe_{0.83}Mn_{0.17}O_{1.1}$ | $Fe_{0.83}Mn_{0.17}O_{1.1}$ |
| 23 | — | $Fe_{0.67}Mn_{0.33}O_{0.87}$ | $Fe_{0.67}Mn_{0.33}O_{0.87}$ | $Fe_{0.67}Mn_{0.33}O_{0.87}$ |
| 24 | — | $Fe_{0.63}Mn_{0.37}O_{0.81}$ | $Fe_{0.63}Mn_{0.37}O_{0.81}$ | $Fe_{0.63}Mn_{0.37}O_{0.81}$ |
| 25 | — | $Fe_{0.59}Mn_{0.41}O_{0.77}$ | $Fe_{0.59}Mn_{0.41}O_{0.77}$ | $Fe_{0.59}Mn_{0.41}O_{0.77}$ |
| 26 | — | $Fe_{0.77}Co_{0.115}Mn_{0.115}$ | $Fe_{0.77}Co_{0.115}Mn_{0.115}$ | $Fe_{0.77}Co_{0.115}Mn_{0.115}$ |
| 27 | — | $Fe_{0.91}Co_{0.045}Mn_{0.045}O_{1.18}$ | $Fe_{0.91}Co_{0.045}Mn_{0.045}O_{1.18}$ | $Fe_{0.91}Co_{0.045}Mn_{0.045}O_{1.18}$ |
| 28 | — | $Fe_{0.83}Co_{0.083}Mn_{0.083}O_{1.08}$ | $Fe_{0.83}Co_{0.083}Mn_{0.083}O_{1.08}$ | $Fe_{0.83}Co_{0.083}Mn_{0.083}O_{1.08}$ |
| 29 | — | $Fe_{0.67}Co_{0.165}Mn_{0.165}O_{0.87}$ | $Fe_{0.67}Co_{0.165}Mn_{0.165}O_{0.87}$ | $Fe_{0.67}Co_{0.165}Mn_{0.165}O_{0.87}$ |
| 30 | — | $Fe_{0.63}Co_{0.185}Mn_{0.185}O_{0.81}$ | $Fe_{0.63}Co_{0.185}Mn_{0.185}O_{0.81}$ | $Fe_{0.63}Co_{0.185}Mn_{0.185}O_{0.81}$ |
| 31 | — | $Fe_{0.56}Co_{0.22}Mn_{0.22}O_{0.72}$ | $Fe_{0.56}Co_{0.22}Mn_{0.22}O_{0.72}$ | $Fe_{0.56}Co_{0.22}Mn_{0.22}O_{0.72}$ |
| 32 | — | $Ni_{0.8}Fe_{0.2}$ | $Ni_{0.8}Fe_{0.2}$ | $Fe_{0.72}Co_{0.14}Mn_{0.14}O_{0.93}$ |

*Sample 19 is a conventional example.

TABLE 7-2

| Sample No. | Composition | | | | MR ratio (%) |
|---|---|---|---|---|---|
| | Region E | Region F | Region G | Region H | |
| 19 | Fe | Fe | Fe | $Fe_{0.67}Mn_{0.33}$ | 10.2 |
| 20 | $Fe_{0.77}Mn_{0.23}$ | $Fe_{0.77}Mn_{0.23}$ | $Fe_{0.77}Mn_{0.23}$ | $Fe_{0.67}Mn_{0.33}$ | 0.1 |
| 21 | $FeO_{1.3}$ | $FeO_{1.3}$ | $FeO_{1.3}$ | $Fe_{0.67}Mn_{0.33}$ | 13.2 |
| 22 | $Fe_{0.83}Mn_{0.17}O_{1.1}$ | $Fe_{0.83}Mn_{0.17}O_{1.1}$ | $Fe_{0.83}Mn_{0.17}O_{1.1}$ | $Fe_{0.67}Mn_{0.33}$ | 15.1 |
| 23 | $Fe_{0.67}Mn_{0.33}O_{0.87}$ | $Fe_{0.67}Mn_{0.33}O_{0.87}$ | $Fe_{0.67}Mn_{0.33}O_{0.87}$ | $Fe_{0.67}Mn_{0.33}$ | 15.3 |
| 24 | $Fe_{0.63}Mn_{0.37}O_{0.81}$ | $Fe_{0.63}Mn_{0.37}O_{0.81}$ | $Fe_{0.63}Mn_{0.37}O_{0.81}$ | $Fe_{0.67}Mn_{0.33}$ | 10.3 |
| 25 | $Fe_{0.59}Mn_{0.41}O_{0.77}$ | $Fe_{0.59}Mn_{0.41}O_{0.77}$ | $Fe_{0.59}Mn_{0.41}O_{0.77}$ | $Fe_{0.67}Mn_{0.33}$ | 1.3 |

TABLE 7-2-continued

| Sample No. | Composition | | | | MR ratio (%) |
|---|---|---|---|---|---|
| | Region E | Region F | Region G | Region H | |
| 26 | $Fe_{0.77}Co_{0.115}Mn_{0.115}$ | $Fe_{0.77}Co_{0.115}Mn_{0.115}$ | $Fe_{0.77}Co_{0.115}Mn_{0.115}$ | $Fe_{0.67}Mn_{0.33}$ | 4.8 |
| 27 | $Fe_{0.91}Co_{0.045}Mn_{0.045}O_{1.18}$ | $Fe_{0.91}Co_{0.045}Mn_{0.045}O_{1.18}$ | $Fe_{0.91}Co_{0.045}Mn_{0.045}O_{1.18}$ | $Fe_{0.67}Mn_{0.33}$ | 15.3 |
| 28 | $Fe_{0.83}Co_{0.083}Mn_{0.083}O_{1.08}$ | $Fe_{0.83}Co_{0.083}Mn_{0.083}O_{1.08}$ | $Fe_{0.83}Co_{0.083}Mn_{0.083}O_{1.08}$ | $Fe_{0.67}Mn_{0.33}$ | 17.5 |
| 29 | $Fe_{0.67}Co_{0.165}Mn_{0.165}O_{0.87}$ | $Fe_{0.67}Co_{0.165}Mn_{0.165}O_{0.87}$ | $Fe_{0.67}Co_{0.165}Mn_{0.165}O_{0.87}$ | $Fe_{0.67}Mn_{0.33}$ | 17.2 |
| 30 | $Fe_{0.63}Co_{0.185}Mn_{0.185}O_{0.81}$ | $Fe_{0.63}Co_{0.185}Mn_{0.185}O_{0.81}$ | $Fe_{0.63}Co_{0.185}Mn_{0.185}O_{0.81}$ | $Fe_{0.67}Mn_{0.33}$ | 10.4 |
| 31 | $Fe_{0.56}Co_{0.22}Mn_{0.22}O_{0.72}$ | $Fe_{0.56}Co_{0.22}Mn_{0.22}O_{0.72}$ | $Fe_{0.56}Co_{0.22}Mn_{0.22}O_{0.72}$ | $Fe_{0.67}Mn_{0.33}$ | 2.4 |
| 32 | $Fe_{0.72}Co_{0.14}Mn_{0.14}O_{0.93}$ | $Fe_{0.5}Co_{0.5}$ | $Fe_{0.5}Co_{0.5}$ | $Fe_{0.67}Mn_{0.33}$ | 18.1 |

*Sample 19 is a conventional example.

TABLE 8-1

| Sample No. | Composition | | | |
|---|---|---|---|---|
| | Region A | Region B | Region C | Region D |
| 33 | — | $Fe_{0.84}Li_{0.16}$ | $Fe_{0.84}Li_{0.16}$ | $Fe_{0.84}Li_{0.16}$ |
| 34 | — | $Fe_{0.95}Li_{0.05}O_{1.24}$ | $Fe_{0.95}Li_{0.05}O_{1.24}$ | $Fe_{0.95}Li_{0.05}O_{1.24}$ |
| 35 | — | $Fe_{0.91}Li_{0.09}O_{1.18}$ | $Fe_{0.91}Li_{0.09}O_{1.18}$ | $Fe_{0.91}Li_{0.09}O_{1.18}$ |
| 36 | — | $Fe_{0.83}Li_{0.17}O_{1.08}$ | $Fe_{0.83}Li_{0.17}O_{1.08}$ | $Fe_{0.83}Li_{0.17}O_{1.08}$ |
| 37 | — | $Fe_{0.8}Li_{0.2}O_{1.04}$ | $Fe_{0.8}Li_{0.2}O_{1.04}$ | $Fe_{0.8}Li_{0.2}O_{1.04}$ |
| 38 | — | $Fe_{0.77}Li_{0.23}O_{1.0}$ | $Fe_{0.77}Li_{0.23}O_{1.0}$ | $Fe_{0.77}Li_{0.23}O_{1.0}$ |
| 39 | — | $Fe_{0.72}Li_{0.28}O_{0.93}$ | $Fe_{0.72}Li_{0.28}O_{0.93}$ | $Fe_{0.72}Li_{0.28}O_{0.93}$ |
| 40 | — | $Fe_{0.77}Mn_{0.15}Li_{0.08}$ | $Fe_{0.77}Mn_{0.15}Li_{0.08}$ | $Fe_{0.77}Mn_{0.15}Li_{0.08}$ |
| 41 | — | $Fe_{0.87}Mn_{0.09}Li_{0.04}O_{1.13}$ | $Fe_{0.87}Mn_{0.09}Li_{0.04}O_{1.13}$ | $Fe_{0.87}Mn_{0.09}Li_{0.04}O_{1.13}$ |
| 42 | — | $Fe_{0.77}Mn_{0.15}Li_{0.08}O_{1.0}$ | $Fe_{0.77}Mn_{0.15}Li_{0.08}O_{1.0}$ | $Fe_{0.77}Mn_{0.15}Li_{0.08}O_{1.0}$ |
| 43 | — | $Fe_{0.69}Mn_{0.21}Li_{0.1}O_{0.9}$ | $Fe_{0.69}Mn_{0.21}Li_{0.1}O_{0.9}$ | $Fe_{0.69}Mn_{0.21}Li_{0.1}O_{0.9}$ |
| 44 | — | $Fe_{0.625}Mn_{0.25}Li_{0.125}O_{0.81}$ | $Fe_{0.625}Mn_{0.25}Li_{0.125}O_{0.81}$ | $Fe_{0.625}Mn_{0.25}Li_{0.125}O_{0.81}$ |

TABLE 8-2

| Sample No. | Composition | | | | MR ratio (%) |
|---|---|---|---|---|---|
| | Region E | Region F | Region G | Region H | |
| 33 | $Fe_{0.84}Li_{0.16}$ | $Fe_{0.84}Li_{0.16}$ | $Fe_{0.84}Li_{0.16}$ | $Fe_{0.67}Mn_{0.33}$ | 7.2 |
| 34 | $Fe_{0.95}Li_{0.05}O_{1.24}$ | $Fe_{0.95}Li_{0.05}O_{1.24}$ | $Fe_{0.95}Li_{0.05}O_{1.24}$ | $Fe_{0.67}Mn_{0.33}$ | 15.3 |
| 35 | $Fe_{0.91}Li_{0.09}O_{1.18}$ | $Fe_{0.91}Li_{0.09}O_{1.18}$ | $Fe_{0.91}Li_{0.09}O_{1.18}$ | $Fe_{0.67}Mn_{0.33}$ | 16.5 |
| 36 | $Fe_{0.83}Li_{0.17}O_{1.08}$ | $Fe_{0.83}Li_{0.17}O_{1.08}$ | $Fe_{0.83}Li_{0.17}O_{1.08}$ | $Fe_{0.67}Mn_{0.33}$ | 15.8 |
| 37 | $Fe_{0.8}Li_{0.2}O_{1.04}$ | $Fe_{0.8}Li_{0.2}O_{1.04}$ | $Fe_{0.8}Li_{0.2}O_{1.04}$ | $Fe_{0.67}Mn_{0.33}$ | 15.6 |
| 38 | $Fe_{0.77}Li_{0.23}O_{1.0}$ | $Fe_{0.77}Li_{0.23}O_{1.0}$ | $Fe_{0.77}Li_{0.23}O_{1.0}$ | $Fe_{0.67}Mn_{0.33}$ | 9.9 |
| 39 | $Fe_{0.72}Li_{0.28}O_{0.93}$ | $Fe_{0.72}Li_{0.28}O_{0.93}$ | $Fe_{0.72}Li_{0.28}O_{0.93}$ | $Fe_{0.67}Mn_{0.33}$ | 1.2 |
| 40 | $Fe_{0.77}Mn_{0.15}Li_{0.08}$ | $Fe_{0.77}Mn_{0.15}Li_{0.08}$ | $Fe_{0.77}Mn_{0.15}Li_{0.08}$ | $Fe_{0.67}Mn_{0.33}$ | 1.9 |
| 41 | $Fe_{0.87}Mn_{0.09}Li_{0.04}O_{1.13}$ | $Fe_{0.87}Mn_{0.09}Li_{0.04}O_{1.13}$ | $Fe_{0.87}Mn_{0.09}Li_{0.04}O_{1.13}$ | $Fe_{0.67}Mn_{0.33}$ | 15.6 |
| 42 | $Fe_{0.77}Mn_{0.15}Li_{0.08}O_{1.0}$ | $Fe_{0.77}Mn_{0.15}Li_{0.08}O_{1.0}$ | $Fe_{0.77}Mn_{0.15}Li_{0.08}O_{1.0}$ | $Fe_{0.67}Mn_{0.33}$ | 15.5 |
| 43 | $Fe_{0.69}Mn_{0.21}Li_{0.1}O_{0.9}$ | $Fe_{0.69}Mn_{0.21}Li_{0.1}O_{0.9}$ | $Fe_{0.69}Mn_{0.21}Li_{0.1}O_{0.9}$ | $Fe_{0.67}Mn_{0.33}$ | 10.8 |
| 44 | $Fe_{0.625}Mn_{0.25}Li_{0.125}O_{0.81}$ | $Fe_{0.625}Mn_{0.25}Li_{0.125}O_{0.81}$ | $Fe_{0.625}Mn_{0.25}Li_{0.125}O_{0.81}$ | $Fe_{0.67}Mn_{0.33}$ | 1.7 |

As shown in Tables 7-1 to 8-2, the MR ratio was decreased signicantly by only adding Mn to a Fe (the sample 20). In contrast, when Mn was added to Fe—O while satisfying the above range of the O/M ratio as described in Example 1 or 2, the MR ratio was improved if a Mn/Fe ratio was not less than 0 and less than 0.5 (the samples 21 to 25).

Comparing the MR ratios obtained in the samples 26 to 31, 33 to 39, and 40 to 44 showed that when metals such as Li, Mn, and Co were added to Fe—O while satisfying the above range of the O/M ratio as described in Example 1 or 2, the MR ratio was improved if a (Co+Mn)/Fe ratio was not less than 0 and less than 0.5, a Li/Fe ratio was not less than 0 and not more than 0.25, or a (n+Li×2)/Fe ratio was not less than 0 and less than 0.5.

In this example, attention was focused on a composition ratio (O/D) of oxygen to metal (D) such as Li, Mn, or Co that was added to Fe. When the metal D was Co or Mn, the MR ratio was improved if the O/D ratio was not less than 2.5. When the metal D was a metal (e.g., Li) that forms a monovalent ion, the MR ratio was improved if the O/D ratio was not less than 5.

The result of the sample 32 showed that the MR ratio also was improved by performing the above composition control only in a range of 2 nm from the interface.

When the amount of Fe was more than 0.4 in the composition ratio of Tables 7-1 to 8-2, the MR ratio was improved. When the amount of Fe was more than 0.5, a particularly large MR ratio was obtained.

The same result also was obtained by replacing Mn or Co with at least one element selected from the group consisting of Ni, Tc, Re, Zn, Cd, Hg, Be, Mg, Ca, Sr, Ba, and Ra. Moreover, the same result also was obtained by replacing Li with at least one element selected from the group consisting of Na, K, Rb, Cs, and Fr.

It has been considered that the MR characteristics of an MR element are degraded due to the presence of an element (e.g., Mn) that is regarded as impurity in the vicinity of the interface. However, when the oxidation state of the ferromagnetic layer in the vicinity of the interface is controlled as described in the present invention, the presence of Mn or the like is useful in improving the MR characteristics.

This phenomenon is attributed to the following possibilities.

A spinel-type compound, which may contribute to an improvement in MR characteristics, consists of a divalent metal ion, two trivalent metal ions, and four oxygen atoms. To produce a spinel-type compound such as $Fe_3O_4$ from $Fe_2O_3$, the trivalent ion should be reduced to the divalent ion. In general, therefore, the conditions of a low oxygen partial pressure and a high temperature of about 1200° C. as described above are necessary. However, a phase region for producing the spinel-type compound may be expanded to cover the range of lower temperature and higher oxygen partial pressure, i.e., a stable region to provide a large MR ratio may be increased by the addition of a metal that tends to form a divalent ion (e.g., Mn or Co) and a metal that forms a monovalent ion (e.g., Li).

When the following elements were added to the MR elements in this example, the general magnetic properties such as soft magnetic property and high-frequency property were improved while maintaining excellent MR characteristics.

When at least one element selected from the group consisting of Ti, Zr, Hf, V, Nb, Ta, Cr, Mo, W, Sc, Y, lanthanide, actinide, Al, Ga, In, and Tl was added in an amount of not more than 0.3 in the composition ratio of Tables 7-1 to 8-2, the general magnetic properties of the MR element were improved while maintaining the MR characteristics. These elements may serve as divalent, trivalent, or tetravalent ions and dissolve in the spinel-type compound such as $Fe_3O_4$ to form a solid solution, thereby adjusting the magnetic properties of the MR element.

Either when at least one element selected from the group consisting of Si, Ge, Sn, Pb, As, Sb, and Bi was added in an amount of not more than 0.3 in the composition ratio of Tables 7-1 to 8-2 or when at least one element selected from the group consisting of B, C, N, P, and S was added in an amount of less than 0.08 in the same composition ratio, the general magnetic properties of the MR element also were improved while maintaining the MR characteristics. These elements may dissolve slightly in the spinel-type compound to form a solid solution or precipitate in a grain boundary, thereby controlling the state of crystal grains and improving the magnetic properties of the MR element.

When the amount of Fe after the addition of the above elements was more than 0.4 in the composition ratio of Tables 7-1 to 8-2, the MR ratio was improved. When the amount of Fe was more than 0.5, a particularly large MR ratio was obtained.

When the reactive film formation method or the in situ oxidation method as described in Example 1 was used, the ferromagnetic layer in the vicinity of the interface was heat-treated (e.g., flash annealing) using a mercury lamp or laser during or after the formation of the ferromagnetic layer, so that it was also possible to provide an MR element with excellent MR characteristics immediately after the film formation. The application of energy may generate a spinel-type compound. Although energy may be applied in the form of light, plasma, or ion beam, a method for applying heat such as heat treatment is simple.

Example 4

Using the same method as Examples 1 to 3, MR elements (samples 45 to 55) with the film configurations shown in Tables 9-1 and 9-2 were prepared.

TABLE 9-1

| Sample No. | Antiferromagnetic layer | Ferromagnetic layer |
|---|---|---|
| 45 | Pt—Mn(15) | Co—Fe(3)/Ru(0.8)/Co—Fe(1)/Fe—Mn—O(2) |
| 46 | Pt—Mn(15) | Co—Fe(3)/Ru(0.8)/Co—Fe(1)/(Fe—Mn—O)Pt(2) |
| 47 | Pt—Mn(15) | Co—Fe(3)/Ru(0.8)/Co—Fe(1)/(Fe—Mn—O)Pt(2) |
| 48 | Pt—Mn(15) | Co—Fe(3)/Ru(0.8)/Co—Fe(1)/(Fe—Mn—O)Pt(2) |
| 49 | Pt—Mn(15) | Co—Fe(3)/Ru(0.8)/Co—Fe(1)/(Fe—Mn—O)Pt(2) |
| 50 | Pt—Mn(15) | Co—Fe(3)/Ru(0.8)/Co—Fe(1)/(Fe—Mn—O)Pt(2) |
| 51 | Pt—Mn(20) | Co—Fe(3)/Ru(0.8)/Co—Fe(1)/(Fe—Mn—O)Pt(2) |
| 52 | Pt—Mn(20) | Co—Fe(3)/Ru(0.8)/Co—Fe(1)/(Fe—Ni—O)Pt—Pd(2) |
| 53 | Pt—Mn(20) | Co—Fe(3)/Ru(0.8)/Co—Fe(1)/(Fe—Ni—O)Pt—Pd(2) |
| 54 | Pt—Mn(20) | Co—Fe(3)/Ru(0.8)/Co—Fe(1)/(Fe—Ni—O)Pt—Pd(2) |
| 55 | Pt—Mn(20) | Co—Fe(3)/Ru(0.8)/Co—Fe(1)/Fe—Co(2) |

TABLE 9-2

| Sample No. | Non-magnetic layer | Ferromagnetic layer |
|---|---|---|
| 45 | Al—O(1) | Fe—Mn—O(2)/Ni—Fe(8) |
| 46 | Al—O(1) | (Fe—Mn—O)Pt(2)/Ni—Fe(8) |
| 47 | Al—O(1) | (Fe—Mn—O)Pt(2)/Ni—Fe(8) |
| 48 | Al—O(1) | (Fe—Mn—O)Pt(2)/Ni—Fe(8) |
| 49 | Al—O(1) | (Fe—Mn—O)Pt(2)/Ni—Fe(8) |
| 50 | Al—O(1) | (Fe—Mn—O)Pt(2)/Ni—Fe(8) |
| 51 | Al—O(1) | (Fe—Co—O)Pt(2)/Ni—Fe(8) |
| 52 | Al—O(1) | Fe—Co(2)/Ni—Fe(8) |
| 53 | Al—O(1) | Fe—Co(2)/Ni—Fe(8) |
| 54 | Al—O(1) | Fe—Co(2)/Ni—Fe(8) |
| 55 | Al—O(1) | (Fe—Ni—O)Pt—Pd(2)/Ni—Fe(8) |

In each sample, a Si substrate provided with a thermal oxide film was used as a substrate, and a laminate of Ta(3)/Cu(50)/Ta(3) was used as a lower electrode. The layers of each of the film configurations in Tables 9-1 and 9-2 were stacked on the lower electrode in the order from left to right (i.e., the antiferromagnetic layer and the ferromagnetic layer in Table 9-1, followed by the non-magnetic layer and the ferromagnetic layer in Table 9-2), thus producing MR elements. In each sample, the Pt—Mn antiferromagnetic layer was arranged between the lower electrode and the ferromagnetic layer. Accordingly, the MR element of each sample was provided as a spin-valve MR element. The ferromagnetic layer that served as a pinned layer included a laminated ferrimagnetic structure (Co—Fe(3)/Ru(0.8)/Co—Fe(1)). In each sample of this example, magnetic anisotropy was imparted to the ferromagnetic layer using the same method as that in Example 3.

In Example 4, the MR ratios of the samples 45 to 50 were measured after heat treatment at 300° C. for 3 hours, and the MR ratios of the samples 51 to 55 were measured before and after heat treatment at different temperatures of 300° C., 350° C., 400° C., and 450° C. for one hour.

Tables 10-1 and 10-2 show the measurements of MR ratio and composition analysis of each of the samples 45 to 50. Tables 11-1, 11-2, and 11-3 show the measurements of MR ratio and composition analysis of each of the samples 51 to 55.

TABLE 10-1

| | Composition | | |
|---|---|---|---|
| Sample No. | Region A to C | Region D | Region E |
| 45 | $Ni_{0.8}Fe_{0.2}$ | $Fe_{0.91}Mn_{0.09}O_{0.91}$ | $Fe_{0.91}Mn_{0.09}O_{0.91}$ |
| 46 | $Ni_{0.8}Fe_{0.2}$ | $(Fe_{0.91}Mn_{0.09}O_{0.91})_{0.9}Pt_{0.1}$ | $(Fe_{0.91}Mn_{0.09}O_{0.91})_{0.9}Pt_{0.1}$ |
| 47 | $Ni_{0.8}Fe_{0.2}$ | $(Fe_{0.91}Mn_{0.09}O_{0.91})_{0.85}Pt_{0.15}$ | $(Fe_{0.91}Mn_{0.09}O_{0.91})_{0.85}Pt_{0.15}$ |
| 48 | $Ni_{0.8}Fe_{0.2}$ | $(Fe_{0.91}Mn_{0.09}O_{0.91})_{0.7}Pt_{0.3}$ | $(Fe_{0.91}Mn_{0.09}O_{0.91})_{0.7}Pt_{0.3}$ |
| 49 | $Ni_{0.8}Fe_{0.2}$ | $(Fe_{0.91}Mn_{0.09}O_{0.91})_{0.6}Pt_{0.4}$ | $(Fe_{0.91}Mn_{0.09}O_{0.91})_{0.6}Pt_{0.4}$ |
| 50 | $Ni_{0.8}Fe_{0.2}$ | $(Fe_{0.91}Mn_{0.09}O_{0.91})_{0.5}Pt_{0.5}$ | $(Fe_{0.91}Mn_{0.09}O_{0.91})_{0.5}Pt_{0.5}$ |

*The MR ratio of each sample was measured after heat treatment at 300° C.

TABLE 10-2

| | Composition | | | MR |
|---|---|---|---|---|
| Sample No. | Region F | Region G | Region H | ratio (%) |
| 45 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 17.2 |
| 46 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 23.3 |
| 47 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 26.1 |
| 48 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 25.8 |
| 49 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 19.7 |
| 50 | $Co_{0.75}Fe_{0.25}Ru_{0.8}$ | $Co_{0.744}Fe_{0.248}Mn_{0.008}$ | $Co_{0.5}Fe_{0.17}Mn_{0.33}Pt_{0.33}$ | 9.6 |

*The MR ratio of each sample was measured after heat treatment at 300° C.

TABLE 11-1

| | Heat treatment | Composition | | |
|---|---|---|---|---|
| Sample No. | temperature (° C.) | Regions A–B | Region C | Region D |
| 51 | — | $Ni_{0.8}Fe_{0.2}$ | $Ni_{0.8}Fe_{0.2}$ | $(Fe_{0.77}Co_{0.23}O_{0.77})_{0.85}Pt_{0.15}$ |
| | 300 | $Ni_{0.8}Fe_{0.2}$ | $Ni_{0.8}Fe_{0.2}$ | $(Fe_{0.77}Co_{0.23}O_{0.77})_{0.85}Pt_{0.15}$ |
| | 350 | $Ni_{0.8}Fe_{0.2}$ | $Ni_{0.8}Fe_{0.2}$ | $(Fe_{0.77}Co_{0.23}O_{0.77})_{0.85}Pt_{0.15}$ |
| | 400 | $Ni_{0.8}Fe_{0.2}$ | $Ni_{0.74}Fe_{0.26}$ | $(Fe_{0.714}Co_{0.214}Ni_{0.072}O_{0.64})_{0.85}Pt_{0.15}$ |
| | 450 | $Ni_{0.8}Fe_{0.2}$ | $Ni_{0.74}Fe_{0.26}$ | $(Fe_{0.69}Co_{0.207}Ni_{0.069}Mn_{0.034}O_{0.62})_{0.85}Pt_{0.15}$ |
| 52 | — | $Ni_{0.8}Fe_{0.2}$ | $Ni_{0.8}Fe_{0.2}$ | $Fe_{0.5}Co_{0.5}$ |
| | 300 | $Ni_{0.8}Fe_{0.2}$ | $Ni_{0.8}Fe_{0.2}$ | $Fe_{0.5}Co_{0.5}$ |
| | 350 | $Ni_{0.8}Fe_{0.2}$ | $Ni_{0.8}Fe_{0.2}$ | $Fe_{0.5}Co_{0.5}$ |
| | 400 | $Ni_{0.8}Fe_{0.2}$ | $Ni_{0.74}Fe_{0.26}$ | $Fe_{0.476}Co_{0.476}Ni_{0.048}$ |
| | 450 | $Ni_{0.8}Fe_{0.2}$ | $Ni_{0.71}Fe_{0.29}$ | $Fe_{0.465}Co_{0.465}Ni_{0.07}$ |
| 53 | — | $Ni_{0.8}Fe_{0.2}$ | $Ni_{0.8}Fe_{0.2}$ | $Fe_{0.5}Co_{0.5}$ |
| | 300 | $Ni_{0.8}Fe_{0.2}$ | $Ni_{0.8}Fe_{0.2}$ | $Fe_{0.5}Co_{0.5}$ |
| | 350 | $Ni_{0.8}Fe_{0.2}$ | $Ni_{0.8}Fe_{0.2}$ | $Fe_{0.5}Co_{0.5}$ |
| | 400 | $Ni_{0.8}Fe_{0.2}$ | $Ni_{0.74}Fe_{0.26}$ | $Fe_{0.476}Co_{0.476}Ni_{0.048}$ |
| | 450 | $Ni_{0.8}Fe_{0.2}$ | $Ni_{0.71}Fe_{0.29}$ | $Fe_{0.465}Co_{0.465}Ni_{0.07}$ |
| 54 | — | $Ni_{0.8}Fe_{0.2}$ | $Ni_{0.8}Fe_{0.2}$ | $Fe_{0.5}Co_{0.5}$ |
| | 300 | $Ni_{0.8}Fe_{0.2}$ | $Ni_{0.8}Fe_{0.2}$ | $Fe_{0.5}Co_{0.5}$ |
| | 350 | $Ni_{0.8}Fe_{0.2}$ | $Ni_{0.8}Fe_{0.2}$ | $Fe_{0.5}Co_{0.5}$ |
| | 400 | $Ni_{0.8}Fe_{0.2}$ | $Ni_{0.74}Fe_{0.26}$ | $Fe_{0.476}Co_{0.476}Ni_{0.048}$ |
| | 450 | $Ni_{0.8}Fe_{0.2}$ | $Ni_{0.71}Fe_{0.29}$ | $Fe_{0.465}Co_{0.465}Ni_{0.07}$ |
| 55 | — | $Ni_{0.8}Fe_{0.2}$ | $Ni_{0.8}Fe_{0.2}$ | $(Fe_{0.8}Ni_{0.2}O_{1.04})_{0.7}Pt_{0.2}Pd_{0.1}$ |
| | 300 | $Ni_{0.8}Fe_{0.2}$ | $Ni_{0.8}Fe_{0.2}$ | $(Fe_{0.8}Ni_{0.2}O_{1.04})_{0.7}Pt_{0.2}Pd_{0.1}$ |
| | 350 | $Ni_{0.8}Fe_{0.2}$ | $Ni_{0.8}Fe_{0.2}$ | $(Fe_{0.8}Ni_{0.2}O_{1.04})_{0.7}Pt_{0.2}Pd_{0.1}$ |
| | 400 | $Ni_{0.8}Fe_{0.2}$ | $Ni_{0.74}Fe_{0.26}$ | $(Fe_{0.77}Ni_{0.23}O_{0.92})_{0.7}Pt_{0.2}Pd_{0.1}$ |
| | 450 | $Ni_{0.8}Fe_{0.2}$ | $Ni_{0.71}Fe_{0.29}$ | $(Fe_{0.74}Ni_{0.26}O_{0.815})_{0.8}Pt_{0.13}Pd_{0.07}$ |

TABLE 11-2

| | Heat treatment | Composition | |
|---|---|---|---|
| Sample No. | temperature (° C.) | Region E | Region F |
| 51 | — | $(Fe_{0.77}Co_{0.23}O_{0.77})_{0.85}Pt_{0.15}$ | $Co_{0.75}Fe_{0.25}Ru_{0.8}$ |
| | 300 | $(Fe_{0.77}Co_{0.23}O_{0.77})_{0.85}Pt_{0.15}$ | $Co_{0.75}Fe_{0.25}Ru_{0.8}$ |
| | 350 | $(Fe_{0.74}Co_{0.22}Mn_{0.04}O_{0.74})_{0.85}Pt_{0.15}$ | $Co_{0.70}Fe_{0.23}Mn_{0.07}Ru_{0.74}$ |
| | 400 | $(Fe_{0.69}Co_{0.21}Mn_{0.10}O_{0.62})_{0.85}Pt_{0.15}$ | $Co_{0.64}Fe_{0.21}Mn_{0.15}Ru_{0.68}$ |
| | 450 | $(Fe_{0.63}Co_{0.185}Mn_{0.185}O_{0.563})_{0.85}Pt_{0.15}$ | $Co_{0.59}Fe_{0.20}Mn_{0.21}Ru_{0.63}$ |

TABLE 11-2-continued

| Sample No. | Heat treatment temperature (° C.) | Composition Region E | Region F |
|---|---|---|---|
| 52 | — | $(Fe_{0.8}Ni_{0.2}O_{0.24})_{0.85}Pt_{0.1}Pd_{0.05}$ | $Co_{0.75}Fe_{0.25}Ru_{0.8}$ |
|  | 300 | $(Fe_{0.8}Ni_{0.2}O_{0.24})_{0.85}Pt_{0.1}Pd_{0.05}$ | $Co_{0.75}Fe_{0.25}Ru_{0.8}$ |
|  | 350 | $(Fe_{0.77}Ni_{0.19}Mn_{0.04}O_{0.23})_{0.85}Pt_{0.1}Pd_{0.05}$ | $Co_{0.70}Fe_{0.23}Mn_{0.07}Ru_{0.74}$ |
|  | 400 | $(Fe_{0.71}Ni_{0.18}Mn_{0.11}O_{0.21})_{0.85}Pt_{0.1}Pd_{0.05}$ | $Co_{0.64}Fe_{0.21}Mn_{0.15}Ru_{0.68}$ |
|  | 450 | $(Fe_{0.65}Ni_{0.16}Mn_{0.19}O_{0.23})_{0.85}Pt_{0.1}Pd_{0.05}$ | $Co_{0.59}Fe_{0.20}Mn_{0.21}Ru_{0.63}$ |
| 53 | — | $(Fe_{0.8}Ni_{0.2}O_{0.56})_{0.85}Pt_{0.1}Pd_{0.05}$ | $Co_{0.75}Fe_{0.25}Ru_{0.8}$ |
|  | 300 | $(Fe_{0.8}Ni_{0.2}O_{0.56})_{0.85}Pt_{0.1}Pd_{0.05}$ | $Co_{0.75}Fe_{0.25}Ru_{0.8}$ |
|  | 350 | $(Fe_{0.77}Ni_{0.19}Mn_{0.04}O_{0.54})_{0.85}Pt_{0.1}Pd_{0.05}$ | $Co_{0.70}Fe_{0.23}Mn_{0.07}Ru_{0.74}$ |
|  | 400 | $(Fe_{0.71}Ni_{0.18}Mn_{0.11}O_{0.5})_{0.85}Pt_{0.1}Pd_{0.05}$ | $Co_{0.64}Fe_{0.21}Mn_{0.15}Ru_{0.68}$ |
|  | 450 | $(Fe_{0.65}Ni_{0.16}Mn_{0.19}O_{0.45})_{0.85}Pt_{0.1}Pd_{0.05}$ | $Co_{0.59}Fe_{0.20}Mn_{0.21}Ru_{0.63}$ |
| 54 | — | $(Fe_{0.8}Ni_{0.2}O_{1.04})_{0.85}Pt_{0.1}Pd_{0.05}$ | $Co_{0.75}Fe_{0.25}Ru_{0.8}$ |
|  | 300 | $(Fe_{0.8}Ni_{0.2}O_{1.04})_{0.85}Pt_{0.1}Pd_{0.05}$ | $Co_{0.75}Fe_{0.25}Ru_{0.8}$ |
|  | 350 | $(Fe_{0.77}Ni_{0.19}Mn_{0.04}O_{0.92})_{0.85}Pt_{0.1}Pd_{0.05}$ | $Co_{0.70}Fe_{0.23}Mn_{0.07}Ru_{0.74}$ |
|  | 400 | $(Fe_{0.71}Ni_{0.18}Mn_{0.11}O_{0.79})_{0.85}Pt_{0.1}Pd_{0.05}$ | $Co_{0.64}Fe_{0.21}Mn_{0.15}Ru_{0.68}$ |
|  | 450 | $(Fe_{0.65}Ni_{0.16}Mn_{0.19}O_{0.71})_{0.85}Pt_{0.1}Pd_{0.05}$ | $Co_{0.59}Fe_{0.20}Mn_{0.21}Ru_{0.63}$ |
| 55 | — | $Fe_{0.71}Co_{0.29}$ | $Co_{0.75}Fe_{0.25}Ru_{0.8}$ |
|  | 300 | $Fe_{0.71}Co_{0.29}$ | $Co_{0.75}Fe_{0.25}Ru_{0.8}$ |
|  | 350 | $Fe_{0.69}Co_{0.275}Mn_{0.035}$ | $Co_{0.70}Fe_{0.23}Mn_{0.07}Ru_{0.74}$ |
|  | 400 | $(Fe_{0.67}Co_{0.26}Mn_{0.07}O_{0.013})_{0.99}Pt_{0.01}$ | $Co_{0.64}Fe_{0.21}Mn_{0.15}Ru_{0.68}$ |
|  | 450 | $(Fe_{0.65}Co_{0.26}Mn_{0.09}O_{0.026})_{0.96}Pt_{0.03}Pd_{0.01}$ | $Co_{0.59}Fe_{0.20}Mn_{0.21}Ru_{0.63}$ |

TABLE 11-3

| Sample No. | Heat treatment temperature (° C.) | Composition Region G | Region H | MR ratio (%) |
|---|---|---|---|---|
| 51 | — | $Co_{0.75}Fe_{0.25}$ | $Co_{0.5}Fe_{0.17}Mn_{0.33}Pt_{0.33}$ | 20.4 |
|  | 300 | $Co_{0.67}Fe_{0.22}Mn_{0.11}$ | $Co_{0.49}Fe_{0.17}Mn_{0.34}Pt_{0.33}$ | 27.8 |
|  | 350 | $Co_{0.6}Fe_{0.2}Mn_{0.2}$ | $Co_{0.48}Fe_{0.16}Mn_{0.36}Pt_{0.32}$ | 31.1 |
|  | 400 | $Co_{0.55}Fe_{0.18}Mn_{0.27}$ | $Co_{0.48}Fe_{0.16}Mn_{0.36}Pt_{0.32}$ | 33.3 |
|  | 450 | $Co_{0.5}Fe_{0.17}Mn_{0.33}Pt_{0.033}$ | $Co_{0.47}Fe_{0.16}Mn_{0.37}Pt_{0.31}$ | 14.2 |
| 52 | — | $Co_{0.75}Fe_{0.25}$ | $Co_{0.5}Fe_{0.17}Mn_{0.33}Pt_{0.33}$ | 18.2 |
|  | 300 | $Co_{0.67}Fe_{0.22}Mn_{0.11}$ | $Co_{0.49}Fe_{0.17}Mn_{0.34}Pt_{0.33}$ | 26.7 |
|  | 350 | $Co_{0.6}Fe_{0.2}Mn_{0.2}$ | $Co_{0.48}Fe_{0.16}Mn_{0.36}Pt_{0.32}$ | 29.9 |
|  | 400 | $Co_{0.55}Fe_{0.18}Mn_{0.27}$ | $Co_{0.48}Fe_{0.16}Mn_{0.36}Pt_{0.32}$ | 31.4 |
|  | 450 | $Co_{0.5}Fe_{0.17}Mn_{0.33}Pt_{0.033}$ | $Co_{0.47}Fe_{0.16}Mn_{0.37}Pt_{0.31}$ | 2.3 |
| 53 | — | $Co_{0.75}Fe_{0.25}$ | $Co_{0.5}Fe_{0.17}Mn_{0.33}Pt_{0.33}$ | 17.8 |
|  | 300 | $Co_{0.67}Fe_{0.22}Mn_{0.11}$ | $Co_{0.49}Fe_{0.17}Mn_{0.34}Pt_{0.33}$ | 25.3 |
|  | 350 | $Co_{0.6}Fe_{0.2}Mn_{0.2}$ | $Co_{0.48}Fe_{0.16}Mn_{0.36}Pt_{0.32}$ | 32.5 |
|  | 400 | $Co_{0.55}Fe_{0.18}Mn_{0.27}$ | $Co_{0.48}Fe_{0.16}Mn_{0.36}Pt_{0.32}$ | 35.2 |
|  | 450 | $Co_{0.5}Fe_{0.17}Mn_{0.33}Pt_{0.033}$ | $Co_{0.47}Fe_{0.16}Mn_{0.37}Pt_{0.31}$ | 5.1 |
| 54 | — | $Co_{0.75}Fe_{0.25}$ | $Co_{0.5}Fe_{0.17}Mn_{0.33}Pt_{0.33}$ | 16.6 |
|  | 300 | $Co_{0.67}Fe_{0.22}Mn_{0.11}$ | $Co_{0.49}Fe_{0.17}Mn_{0.34}Pt_{0.33}$ | 23.7 |
|  | 350 | $Co_{0.6}Fe_{0.2}Mn_{0.2}$ | $Co_{0.48}Fe_{0.16}Mn_{0.36}Pt_{0.32}$ | 27.4 |
|  | 400 | $Co_{0.55}Fe_{0.18}Mn_{0.27}$ | $Co_{0.48}Fe_{0.16}Mn_{0.36}Pt_{0.32}$ | 37.8 |
|  | 450 | $Co_{0.5}Fe_{0.17}Mn_{0.33}Pt_{0.033}$ | $Co_{0.47}Fe_{0.16}Mn_{0.37}Pt_{0.31}$ | 8.9 |
| 55 | — | $Co_{0.75}Fe_{0.25}$ | $Co_{0.5}Fe_{0.17}Mn_{0.33}Pt_{0.33}$ | 15.5 |
|  | 300 | $Co_{0.67}Fe_{0.22}Mn_{0.11}$ | $Co_{0.49}Fe_{0.17}Mn_{0.34}Pt_{0.33}$ | 18.9 |
|  | 350 | $Co_{0.6}Fe_{0.2}Mn_{0.2}$ | $Co_{0.48}Fe_{0.16}Mn_{0.36}Pt_{0.32}$ | 28.1 |
|  | 400 | $Co_{0.55}Fe_{0.18}Mn_{0.27}$ | $Co_{0.48}Fe_{0.16}Mn_{0.36}Pt_{0.32}$ | 17.8 |
|  | 450 | $Co_{0.5}Fe_{0.17}Mn_{0.33}Pt_{0.033}$ | $Co_{0.47}Fe_{0.16}Mn_{0.37}Pt_{0.31}$ | 7.6 |

As shown in Tables 10-1 and 10-2, when the oxidation state of the ferromagnetic layer in the vicinity of the interface was controlled within the above range of the O/M ratio as described in Example 1 or 2, and Pt was added by not more than 40% of the total in the composition ratio of Table 10-1 and 10-2, the MR ratio was more improved.

As shown in Tables 11-1 to 11-3, when the oxidation state of the ferromagnetic layer in the vicinity of the interface was controlled within the above range of the O/M ratio as described in Example 1 or 2, elements such as Co, Mn, and Ni were added within the range as described in Example 3 or the like, and elements such as Pt and Pd were added in an amount not more than 40% of the total in the composition ratio of Tables 11-1 to 11-3, the MR ratio was improved significantly after heat treatment at not less than 350° C. compared, e.g., with the conventional example (the sample 9) in Table 4.

As shown in the samples 52 to 54, when the oxidation state and composition of only one of the ferromagnetic layers sandwiching the non-magnetic layer were controlled, the MR ratio also was improved.

When at least one element selected from the group consisting of Ir, Rh, Os, Ru, Cu, Ag, and Au was used other than Pt and Pd shown in Tables 10-1 to 11-3, the same result was obtained. When combinations such as (Pt, Pd) and (Pt, Cu) were added at a ratio of 1:1, or combinations such as (Ir, Pd, Rh), (Ru, Os, Ir), (Rh, Ir, Pt), (Pd, Pt, Cu), (Cu, Ag, Au), (Ru, Rh, Pd), and (Ir, Pt, Cu) were added at a ratio of 1:1:1, 2:1:1, or 3:2:1, the same result also was obtained.

An element group including, e.g., Pt and Pd, unlike other element groups that constitute the ferromagnetic layer, is not taken into account in controlling the oxidation state (i.e., the element group is excluded from the element M of the O/M ratio). The reason for this is considered to be that the free energy of this element group for forming a compound with oxygen is smaller than the free energy of the other element groups.

The improvement in heat resistance of the resultant MR element is attributed to the following possibility. The above element groups have the effect of an oxidation-reduction catalyst and thus may accelerate a reaction for producing a spinel-type compound ($Fe_2O_3 \rightarrow Fe_3O_4$) or suppress a reaction for decomposing the spinel-type compound ($Fe_3O_4 \rightarrow FeO$). In particular, the use of an oxidation catalyst, e.g., Pt, Ir, or Rh may suppress the reaction of $Fe_3O_4 \rightarrow FeO$, and actually the heat resistance of the MR element in the temperature range of not less than 350° C. is improved significantly. Moreover, the same result may be obtained even by using elements other than the above elements, as long as the elements have the same effect of an oxidation-reduction catalyst.

Example 5

As described in Example 3 or 4, the MR element stably can have a large MR ratio by the addition of Mn within a specific range. Mn may be added, e.g., by performing heat treatment to cause diffusion of Mn from the antiferromagnetic layer including Mn (e.g., Pt—Mn, Pd—Pt—Mn, Ir—Mn, Fe—Mn, Ni—Mn, or Rh—Mn) to the vicinity of the interface of the ferromagnetic layer. In this method, however, Mn is likely to diffuse more than necessary, so that the composition of the ferromagnetic layer in the vicinity of the interface deviates from the above range, which may lead to degradation of the MR characteristics. When Mn diffuses more than necessary, the magnetic properties of the ferromagnetic layer in the vicinity of the interface may be degraded, and structural defects in the non-magnetic layer may be increased.

In Example 5, a sample 56 with the film configuration shown in Table 12 was prepared. Then, Mn was added in the vicinity of the interface of the ferromagnetic layer, and the composition was controlled while varying a distance between the antiferromagnetic layer including Mn and the interface. A distance t from the antiferromagnetic layer to the interface was controlled by changing a thickness $t_1$ of a Co—Fe layer included in the ferromagnetic layer. Ten samples with different distances t of 2, 3, 5, 10, 20, 30, 40, 50, 60, and 70 nm were used in Example 5.

TABLE 12

| Sample No. | Antiferromagnetic layer | Ferromagnetic layer | Non-magnetic layer | Ferromagnetic layer |
|---|---|---|---|---|
| 56 | Pt—Mn(50) | Co—Fe($t_1$)/(Fe—Co—O)Pt(2) | Al—O(1) | (Fe—Co—O)Pt(2)/Ni—Fe(8) |

In each sample, like Examples 1 to 4, a Si substrate provided with a thermal oxide film was used as a substrate, and a laminate of Ta(3)/Cu(50)/Ta(3) was used as a lower electrode. In each sample, magnetic anisotropy was imparted to the ferromagnetic layer using the same method as that in Examples 3 and 4.

Tables 13-1, 13-2, 13-3, 14-1, 14-2, and 14-3 show the measurements of MR ratio and composition analysis of the sample 56. The regions indicated by "Pt—Mn" in Table 13-3 have the same composition as that of the antiferromagnetic layer.

TABLE 13-1

| Sample No. | Distance t (nm) | Heat treatment temperature (° C.) | Composition Region A–B | Region C | Region D |
|---|---|---|---|---|---|
| 56 | 2 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
| | | 450 | $Ni_{0.8}Fe_{0.2}$ | $Ni_{0.74}Fe_{0.26}$ | $(Fe_{0.69}Co_{0.207}Ni_{0.069}Mn_{0.034}O_{0.62})_{0.9}Pt_{0.1}$ |
| | 3 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
| | | 450 | $Ni_{0.8}Fe_{0.2}$ | $Ni_{0.74}Fe_{0.26}$ | $(Fe_{0.7}Co_{0.21}Ni_{0.07}Mn_{0.02}O_{0.63})_{0.9}Pt_{0.1}$ |
| | 5 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
| | | 450 | $Ni_{0.8}Fe_{0.2}$ | $Ni_{0.74}Fe_{0.26}$ | $(Fe_{0.7}Co_{0.21}Ni_{0.07}Mn_{0.02}O_{0.63})_{0.9}Pt_{0.1}$ |
| | 10 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
| | | 450 | $Ni_{0.8}Fe_{0.2}$ | $Ni_{0.74}Fe_{0.26}$ | $(Fe_{0.71}Co_{0.213}Ni_{0.07}Mn_{0.007}O_{0.649})_{0.9}Pt_{0.1}$ |
| | 20 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
| | | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
| | | 450 | $Ni_{0.8}Fe_{0.2}$ | $Ni_{0.74}Fe_{0.26}$ | $(Fe_{0.71}Co_{0.213}Ni_{0.07}Mn_{0.007}O_{0.649})_{0.9}Pt_{0.1}$ |

TABLE 13-2

| Sample No. | Distance t (nm) | Heat treatment temperature (° C.) | Composition Region E | Region F |
|---|---|---|---|---|
| 56 | 2 | — | $(Fe_{0.77}Co_{0.23}O_{0.77})_{0.9}Pt_{0.1}$ | $Co_{0.5}Fe_{0.5}$ |
|  |  | 300 | $(Fe_{0.667}Co_{0.2}Mn_{0.133}O_{0.67})_{0.9}Pt_{0.1}$ | $Co_{0.435}Fe_{0.435}Mn_{0.13}$ |
|  |  | 350 | $(Fe_{0.588}Co_{0.176}Mn_{0.236}O_{0.59})_{0.9}Pt_{0.1}$ | $Co_{0.37}Fe_{0.37}Mn_{0.26}$ |
|  |  | 400 | $(Fe_{0.5}Co_{0.15}Mn_{0.35}O_{0.45})_{0.9}Pt_{0.1}$ | $Co_{0.31}Fe_{0.31}Mn_{0.38}$ |
|  |  | 450 | $(Fe_{0.417}Co_{0.125}Mn_{0.458}O_{0.38})_{0.9}Pt_{0.1}$ | $Co_{0.26}Fe_{0.26}Mn_{0.48}$ |
|  | 3 | — | $(Fe_{0.77}Co_{0.23}O_{0.77})_{0.9}Pt_{0.1}$ | $Co_{0.5}Fe_{0.5}$ |
|  |  | 300 | $(Fe_{0.70}Co_{0.21}Mn_{0.09}O_{0.70})_{0.9}Pt_{0.1}$ | $Co_{0.455}Fe_{0.455}Mn_{0.09}$ |
|  |  | 350 | $(Fe_{0.645}Co_{0.194}Mn_{0.161}O_{0.65})_{0.9}Pt_{0.1}$ | $Co_{0.385}Fe_{0.385}Mn_{0.23}$ |
|  |  | 400 | $(Fe_{0.556}Co_{0.167}Mn_{0.277}O_{0.5})_{0.9}Pt_{0.1}$ | $Co_{0.32}Fe_{0.32}Mn_{0.36}$ |
|  |  | 450 | $(Fe_{0.455}Co_{0.136}Mn_{0.409}O_{0.41})_{0.9}Pt_{0.1}$ | $Co_{0.27}Fe_{0.27}Mn_{0.46}$ |
|  | 5 | — | $(Fe_{0.77}Co_{0.23}O_{0.77})_{0.9}Pt_{0.1}$ | $Co_{0.5}Fe_{0.5}$ |
|  |  | 300 | $(Fe_{0.724}Co_{0.218}Mn_{0.058}O_{0.72})_{0.9}Pt_{0.1}$ | $Co_{0.46}Fe_{0.46}Mn_{0.08}$ |
|  |  | 350 | $(Fe_{0.69}Co_{0.21}Mn_{0.10}O_{0.69})_{0.9}Pt_{0.1}$ | $Co_{0.42}Fe_{0.42}Mn_{0.16}$ |
|  |  | 400 | $(Fe_{0.61}Co_{0.18}Mn_{0.21}O_{0.55})_{0.9}Pt_{0.1}$ | $Co_{0.36}Fe_{0.36}Mn_{0.28}$ |
|  |  | 450 | $(Fe_{0.526}Co_{0.158}Mn_{0.316}O_{0.47})_{0.9}Pt_{0.1}$ | $Co_{0.32}Fe_{0.32}Mn_{0.36}$ |
|  | 10 | — | $(Fe_{0.77}Co_{0.23}O_{0.77})_{0.9}Pt_{0.1}$ | $Co_{0.5}Fe_{0.5}$ |
|  |  | 300 | $(Fe_{0.75}Co_{0.225}Mn_{0.025}O_{0.75})_{0.9}Pt_{0.1}$ | $Co_{0.48}Fe_{0.48}Mn_{0.04}$ |
|  |  | 350 | $(Fe_{0.724}Co_{0.218}Mn_{0.058}O_{0.72})_{0.9}Pt_{0.1}$ | $Co_{0.455}Fe_{0.455}Mn_{0.09}$ |
|  |  | 400 | $(Fe_{0.69}Co_{0.21}Mn_{0.1}O_{0.62})_{0.9}Pt_{0.1}$ | $Co_{0.42}Fe_{0.42}Mn_{0.16}$ |
|  |  | 450 | $(Fe_{0.645}Co_{0.194}Mn_{0.161}O_{0.58})_{0.9}Pt_{0.1}$ | $Co_{0.385}Fe_{0.385}Mn_{0.23}$ |
|  | 20 | — | $(Fe_{0.77}Co_{0.23}O_{0.77})_{0.9}Pt_{0.1}$ | $Co_{0.5}Fe_{0.5}$ |
|  |  | 300 | $(Fe_{0.763}Co_{0.229}Mn_{0.008}O_{0.76})_{0.9}Pt_{0.1}$ | $Co_{0.493}Fe_{0.493}Mn_{0.014}$ |
|  |  | 350 | $(Fe_{0.75}Co_{0.225}Mn_{0.025}O_{0.75})_{0.9}Pt_{0.1}$ | $Co_{0.476}Fe_{0.476}Mn_{0.048}$ |
|  |  | 400 | $(Fe_{0.714}Co_{0.214}Mn_{0.072}O_{0.64})_{0.9}Pt_{0.1}$ | $Co_{0.435}Fe_{0.435}Mn_{0.13}$ |
|  |  | 450 | $(Fe_{0.67}Co_{0.2}Mn_{0.13}O_{0.6})_{0.9}Pt_{0.1}$ | $Co_{0.4}Fe_{0.4}Mn_{0.2}$ |

TABLE 13-3

| Sample No. | Distance t (nm) | Heat treatment temperature (° C.) | Composition Region G | Region H | MR ratio (%) |
|---|---|---|---|---|---|
| 56 | 2 | — | Pt—Mn | Pt—Mn | 18.8 |
|  |  | 300 | Pt—Mn | Pt—Mn | 12.1 |
|  |  | 350 | Pt—Mn | Pt—Mn | 4.3 |
|  |  | 400 | Pt—Mn | Pt—Mn | 2.6 |
|  |  | 450 | Pt—Mn | Pt—Mn | 0.3 |
|  | 3 | — | $Co_{0.34}Fe_{0.33}Mn_{0.33}Pt_{0.33}$ | Pt—Mn | 18.4 |
|  |  | 300 | $Co_{0.295}Fe_{0.295}Mn_{0.41}Pt_{0.295}$ | Pt—Mn | 26.3 |
|  |  | 350 | $Co_{0.27}Fe_{0.27}Mn_{0.46}Pt_{0.27}$ | Pt—Mn | 10.3 |
|  |  | 400 | $Co_{0.24}Fe_{0.24}Mn_{0.52}Pt_{0.24}$ | Pt—Mn | 4.5 |
|  |  | 450 | $Co_{0.21}Fe_{0.21}Mn_{0.58}Pt_{0.21}$ | Pt—Mn | 1.1 |
|  | 5 | — | $Co_{0.5}Fe_{0.5}$ | $Co_{0.34}Fe_{0.33}Mn_{0.33}Pt_{0.33}$ | 18.5 |
|  |  | 300 | $Co_{0.455}Fe_{0.455}Mn_{0.09}$ | $Co_{0.295}Fe_{0.295}Mn_{0.41}Pt_{0.295}$ | 27.2 |
|  |  | 350 | $Co_{0.385}Fe_{0.385}Mn_{0.23}$ | $Co_{0.27}Fe_{0.27}Mn_{0.46}Pt_{0.27}$ | 34.5 |
|  |  | 400 | $Co_{0.32}Fe_{0.32}Mn_{0.36}$ | $Co_{0.24}Fe_{0.24}Mn_{0.52}Pt_{0.24}$ | 6.5 |
|  |  | 450 | $Co_{0.27}Fe_{0.27}Mn_{0.46}$ | $Co_{0.21}Fe_{0.21}Mn_{0.58}Pt_{0.21}$ | 1.2 |
|  | 10 | — | $Co_{0.5}Fe_{0.5}$ | $Co_{0.5}Fe_{0.5}$ | 18.3 |
|  |  | 300 | $Co_{0.46}Fe_{0.46}Mn_{0.08}$ | $Co_{0.455}Fe_{0.455}Mn_{0.09}$ | 26.8 |
|  |  | 350 | $Co_{0.42}Fe_{0.42}Mn_{0.16}$ | $Co_{0.385}Fe_{0.385}Mn_{0.23}$ | 35.1 |
|  |  | 400 | $Co_{0.35}Fe_{0.35}Mn_{0.3}$ | $Co_{0.32}Fe_{0.32}Mn_{0.36}$ | 38.2 |
|  |  | 450 | $Co_{0.3}Fe_{0.3}Mn_{0.4}$ | $Co_{0.27}Fe_{0.27}Mn_{0.46}$ | 7.6 |
|  | 20 | — | $Co_{0.5}Fe_{0.5}$ | $Co_{0.5}Fe_{0.5}$ | 17.9 |
|  |  | 300 | $Co_{0.478}Fe_{0.478}Mn_{0.044}$ | $Co_{0.444}Fe_{0.444}Mn_{0.112}$ | 26.7 |
|  |  | 350 | $Co_{0.444}Fe_{0.444}Mn_{0.112}$ | $Co_{0.385}Fe_{0.385}Mn_{0.23}$ | 32.3 |
|  |  | 400 | $Co_{0.37}Fe_{0.37}Mn_{0.26}$ | $Co_{0.328}Fe_{0.328}Mn_{0.344}$ | 37.6 |
|  |  | 450 | $Co_{0.32}Fe_{0.32}Mn_{0.36}$ | $Co_{0.278}Fe_{0.278}Mn_{0.444}$ | 23.1 |

TABLE 14-1

| Sample No. | Distance t (nm) | Heat treatment temperature (° C.) | Composition Region A–B | Region C | Region D |
|---|---|---|---|---|---|
| 56 | 30 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  |  | 450 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  | 40 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  |  | 450 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  | 50 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  |  | 450 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  | 60 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  |  | 450 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  | 70 | — | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 300 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 350 | $Ni_{0.8}Fe_{0.2}$ | $Ni_{0.8}Fe_{0.2}$ | $(Fe_{0.77}Co_{0.23}O_{0.77})_{0.9}Pt_{0.1}$ |
|  |  | 400 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |
|  |  | 450 | $Ni_{0.8}Fe_{0.2}$ | $Ni_{0.74}Fe_{0.26}$ | $(Fe_{0.714}Co_{0.214}Ni_{0.072}O_{0.64})_{0.9}Pt_{0.1}$ |

TABLE 14-2

| Sample No. | Distance t (nm) | Heat treatment temperature (° C.) | Composition Region E | Region F |
|---|---|---|---|---|
| 56 | 30 | — | $(Fe_{0.77}Co_{0.23}O_{0.77})_{0.9}Pt_{0.1}$ | $Co_{0.5}Fe_{0.5}$ |
|  |  | 300 | $(Fe_{0.77}Co_{0.23}O_{0.77})_{0.9}Pt_{0.1}$ | $Co_{0.495}Fe_{0.495}Mn_{0.01}$ |
|  |  | 350 | $(Fe_{0.758}Co_{0.227}Mn_{0.015}O_{0.76})_{0.9}Pt_{0.1}$ | $Co_{0.48}Fe_{0.48}Mn_{0.04}$ |
|  |  | 400 | $(Fe_{0.73}Co_{0.22}Mn_{0.05}O_{0.66})_{0.9}Pt_{0.1}$ | $Co_{0.455}Fe_{0.455}Mn_{0.09}$ |
|  |  | 450 | $(Fe_{0.69}Co_{0.21}Mn_{0.1}O_{0.62})_{0.9}Pt_{0.1}$ | $Co_{0.42}Fe_{0.42}Mn_{0.16}$ |
|  | 40 | — | $(Fe_{0.77}Co_{0.23}O_{0.77})_{0.9}Pt_{0.1}$ | $Co_{0.5}Fe_{0.5}$ |
|  |  | 300 | $(Fe_{0.77}Co_{0.23}O_{0.77})_{0.9}Pt_{0.1}$ | $Co_{0.5}Fe_{0.5}$ |
|  |  | 350 | $(Fe_{0.77}Co_{0.23}O_{0.77})_{0.9}Pt_{0.1}$ | $Co_{0.495}Fe_{0.495}Mn_{0.01}$ |
|  |  | 400 | $(Fe_{0.75}Co_{0.225}Mn_{0.025}O_{0.68})_{0.9}Pt_{0.1}$ | $Co_{0.476}Fe_{0.476}Mn_{0.048}$ |
|  |  | 450 | $(Fe_{0.72}Co_{0.216}Mn_{0.064}O_{0.65})_{0.9}Pt_{0.1}$ | $Co_{0.435}Fe_{0.435}Mn_{0.13}$ |
|  | 50 | — | $(Fe_{0.77}Co_{0.23}O_{0.77})_{0.9}Pt_{0.1}$ | $Co_{0.5}Fe_{0.5}$ |
|  |  | 300 | $(Fe_{0.77}Co_{0.23}O_{0.77})_{0.9}Pt_{0.1}$ | $Co_{0.5}Fe_{0.5}$ |
|  |  | 350 | $(Fe_{0.77}Co_{0.23}O_{0.77})_{0.9}Pt_{0.1}$ | $Co_{0.5}Fe_{0.5}$ |
|  |  | 400 | $(Fe_{0.763}Co_{0.229}Mn_{0.008}O_{0.69})_{0.9}Pt_{0.1}$ | $Co_{0.49}Fe_{0.49}Mn_{0.02}$ |
|  |  | 450 | $(Fe_{0.746}Co_{0.224}Mn_{0.03}O_{0.67})_{0.9}Pt_{0.1}$ | $Co_{0.47}Fe_{0.47}Mn_{0.06}$ |
|  | 60 | — | $(Fe_{0.77}Co_{0.23}O_{0.77})_{0.9}Pt_{0.1}$ | $Co_{0.5}Fe_{0.5}$ |
|  |  | 300 | $(Fe_{0.77}Co_{0.23}O_{0.77})_{0.9}Pt_{0.1}$ | $Co_{0.5}Fe_{0.5}$ |
|  |  | 350 | $(Fe_{0.77}Co_{0.23}O_{0.77})_{0.9}Pt_{0.1}$ | $Co_{0.5}Fe_{0.5}$ |
|  |  | 400 | $(Fe_{0.77}Co_{0.23}O_{0.77})_{0.9}Pt_{0.1}$ | $Co_{0.5}Fe_{0.5}$ |
|  |  | 450 | $(Fe_{0.77}Co_{0.23}O_{0.77})_{0.9}Pt_{0.1}$ | $Co_{0.488}Fe_{0.488}Mn_{0.024}$ |
|  | 70 | — | $(Fe_{0.77}Co_{0.23}O_{0.77})_{0.9}Pt_{0.1}$ | $Co_{0.5}Fe_{0.5}$ |
|  |  | 300 | $(Fe_{0.77}Co_{0.23}O_{0.77})_{0.9}Pt_{0.1}$ | $Co_{0.5}Fe_{0.5}$ |
|  |  | 350 | $(Fe_{0.77}Co_{0.23}O_{0.77})_{0.9}Pt_{0.1}$ | $Co_{0.5}Fe_{0.5}$ |
|  |  | 400 | $(Fe_{0.77}Co_{0.23}O_{0.77})_{0.9}Pt_{0.1}$ | $Co_{0.5}Fe_{0.5}$ |
|  |  | 450 | $(Fe_{0.77}Co_{0.23}O_{0.77})_{0.9}Pt_{0.1}$ | $Co_{0.5}Fe_{0.5}$ |

TABLE 14-3

| Sample No. | Distance t (nm) | Heat treatment temperature (° C.) | Composition Region G | Composition Region H | MR ratio (%) |
|---|---|---|---|---|---|
| 56 | 30 | — | $Co_{0.5}Fe_{0.5}$ | $Co_{0.5}Fe_{0.5}$ | 17.6 |
|  |  | 300 | $Co_{0.485}Fe_{0.485}Mn_{0.03}$ | $Co_{0.455}Fe_{0.455}Mn_{0.09}$ | 26.4 |
|  |  | 350 | $Co_{0.45}Fe_{0.45}Mn_{0.1}$ | $Co_{0.4}Fe_{0.4}Mn_{0.2}$ | 29.5 |
|  |  | 400 | $Co_{0.385}Fe_{0.385}Mn_{0.23}$ | $Co_{0.34}Fe_{0.33}Mn_{0.33}$ | 33.4 |
|  |  | 450 | $Co_{0.34}Fe_{0.33}Mn_{0.33}$ | $Co_{0.285}Fe_{0.285}Mn_{0.43}$ | 22.4 |
|  | 40 | — | $Co_{0.5}Fe_{0.5}$ | $Co_{0.5}Fe_{0.5}$ | 17.7 |
|  |  | 300 | $Co_{0.493}Fe_{0.493}Mn_{0.014}$ | $Co_{0.465}Fe_{0.465}Mn_{0.07}$ | 25.8 |
|  |  | 350 | $Co_{0.476}Fe_{0.476}Mn_{0.048}$ | $Co_{0.435}Fe_{0.435}Mn_{0.13}$ | 27.6 |
|  |  | 400 | $Co_{0.435}Fe_{0.435}Mn_{0.13}$ | $Co_{0.385}Fe_{0.385}Mn_{0.23}$ | 30.2 |
|  |  | 450 | $Co_{0.385}Fe_{0.385}Mn_{0.23}$ | $Co_{0.34}Fe_{0.33}Mn_{0.33}$ | 21.6 |
|  | 50 | — | $Co_{0.5}Fe_{0.5}$ | $Co_{0.5}Fe_{0.5}$ | 17.4 |
|  |  | 300 | $Co_{0.5}Fe_{0.5}$ | $Co_{0.476}Fe_{0.476}Mn_{0.048}$ | 25.9 |
|  |  | 350 | $Co_{0.483}Fe_{0.483}Mn_{0.034}$ | $Co_{0.444}Fe_{0.444}Mn_{0.112}$ | 27.1 |
|  |  | 400 | $Co_{0.46}Fe_{0.46}Mn_{0.08}$ | $Co_{0.42}Fe_{0.42}Mn_{0.16}$ | 29.3 |
|  |  | 450 | $Co_{0.435}Fe_{0.435}Mn_{0.13}$ | $Co_{0.385}Fe_{0.385}Mn_{0.23}$ | 20.7 |
|  | 60 | — | $Co_{0.5}Fe_{0.5}$ | $Co_{0.5}Fe_{0.5}$ | 17.2 |
|  |  | 300 | $Co_{0.5}Fe_{0.5}$ | $Co_{0.488}Fe_{0.488}Mn_{0.024}$ | 23.6 |
|  |  | 350 | $Co_{0.5}Fe_{0.5}$ | $Co_{0.476}Fe_{0.476}Mn_{0.048}$ | 26.5 |
|  |  | 400 | $Co_{0.488}Fe_{0.488}Mn_{0.024}$ | $Co_{0.455}Fe_{0.455}Mn_{0.09}$ | 18.1 |
|  |  | 450 | $Co_{0.465}Fe_{0.465}Mn_{0.07}$ | $Co_{0.435}Fe_{0.435}Mn_{0.13}$ | 7.4 |
|  | 70 | — | $Co_{0.5}Fe_{0.5}$ | $Co_{0.5}Fe_{0.5}$ | 16.9 |
|  |  | 300 | $Co_{0.5}Fe_{0.5}$ | $Co_{0.493}Fe_{0.493}Mn_{0.014}$ | 21.9 |
|  |  | 350 | $Co_{0.5}Fe_{0.5}$ | $Co_{0.48}Fe_{0.48}Mn_{0.04}$ | 10.3 |
|  |  | 400 | $Co_{0.5}Fe_{0.5}$ | $Co_{0.465}Fe_{0.465}Mn_{0.07}$ | 6.8 |
|  |  | 450 | $Co_{0.488}Fe_{0.488}Mn_{0.024}$ | $Co_{0.455}Fe_{0.455}Mn_{0.09}$ | 2.4 |

As shown in Tables 13-1 to 14-3, in the sample with a distance t of 2 nm, a large amount of Mn diffused to the vicinity of the interface of the ferromagnetic layer by heat treatment at not less than 300° C., so that the MR ratio was decreased significantly. In this case, the antiferromagnetic layer and the non-magnetic layer may be in direct contact through a grain boundary of the ferromagnetic layer due to a small thickness of the ferromagnetic layer arranged therebetween.

In the sample with a distance t of 3 nm or more, Mn diffused appropriately to the vicinity of the interface of the ferromagnetic layer, so that the MR ratio was improved in a certain heat treatment temperature range. In particular, the MR ratios of the samples with a distance t of 10 nm to 60 nm were improved over the entire heat treatment temperature range of 300° C. to 450° C.

However, when a distance t was more than 50 nm, it was rather difficult for Mn to diffuse to the vicinity of the interface. In this case, the growth form of the ferromagnetic layer may be changed from being affected by the underlying layer to a growth form depending on self-energy that is close to a bulk. Therefore, a fine structure (e.g., a grain boundary) in the ferromagnetic layer may be changed, and thus heat treatment at not less than 500° C. or long-time heat treatment may be required for Mn to diffuse to the vicinity of the interface.

These results show that the distance between the antiferromagnetic layer and the non-magnetic layer preferably ranges from 3 nm to 50 nm so that the amount of Mn added in the vicinity of the interface should be controlled within the range as described in Example 3 or the like at a heat treatment temperature of about 300° C. to 450° C. When the distance falls in this range, the amount of Mn added in the vicinity of the interface of the ferromagnetic layer can be controlled within the above range by utilizing diffusion while adjusting heat treatment temperature and/or time. Thus, an MR element with excellent MR characteristics can be achieved.

After analyzing the interface composition, some samples in Examples 1 to 5 were evaluated by examining the composition distribution and the crystal grain distribution after heat treatment using bulk alloys. The bulk alloys had the same composition as those samples except that they did not include O. Moreover, the correlation between the results of the bulk alloys and various physical properties such as MR characteristics and heat resistance of the working samples (i.e., samples in the form of an MR element) was examined. The procedure of this method is as follows.

First, an alloy whose composition (not including O) was adjusted to be the same as the composition of the working sample was molded by general molding and then heat-treated in an inert gas atmosphere at 350° C. to 450° C. for 24 hours. Next, the alloy was cut in half, the cutting plane was polished, and the surface of the cutting plane was etched. The state of crystal grains of each alloy was observed with a metallurgical microscope and electron microscope. Subsequently, the composition distribution was evaluated using surface analysis or composition analysis such as EDX.

As a result, it was seen that the sample with the composition that was proved to show uniform composition distribution and crystal grains by the examination of the bulk alloy was likely to be superior in stability of the MR characteristics in long-time heat treatment. When the sample with the composition that was proved to show nonuniform composition distribution by the examination of the bulk alloy was likely to be degraded in MR characteristics by heat treatment. The phase stability of a bulk differs from that of a thin film due to, e.g., the interfacial effect. However, in the sample that corresponded to the bulk alloy having nonuniform composition distribution, heat treatment may cause a plurality of different composition regions in the vicinity of the interface, so that some regions may be outside the range of the O/M ratio as described in Example 1 or 2.

As described above, the present invention can provide a magnetoresistive element with excellent heat resistance and MR characteristics. Moreover, the present invention can provide a magnetoresistive element that exhibits excellent MR characteristics after heat treatment at 300° C. or more, particularly 350° C. to 380° C. or more. A magnetoresistive element of the present invention can be used in devices such as a magnetic head, a magnetic recording apparatus, and a magnetic memory (MRAM). These devices including a magnetoresistive element of the present invention can have excellent heat resistance and characteristics.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetoresistive element comprising:
   a multilayer structure comprising a non-magnetic layer and a pair of ferromagnetic layers stacked on both sides of the non-magnetic layer,
   wherein a resistance value differs depending on a relative angle between magnetization directions of the ferromagnetic layers at interfaces with the non-magnetic layer, and
   a composition of at least one of the ferromagnetic layers in a range of 2 nm from the interface with the non-magnetic layer is expressed by $(M_xO_y)_{1-z}Z_z$ where Z is at least one element selected from the group consisting of Ru, Os, Rh, Ir, Pd, Pt, Cu, Ag, and Au, M is at least one element selected from the group consisting of elements other than Z and O and includes a ferromagnetic metal, and x, y, and z satisfy $0.33 < y/x < 1.33$, $0 < x$, $0 < y$, and $0 < z \leq 0.4$.

2. A magnetoresistive element comprising:
   a multilayer structure comprising a non-magnetic layer and a pair of ferromagnetic layers stacked on both sides of the non-magnetic layer,
   wherein a resistance value differs depending on a relative angle between magnetization directions of the ferromagnetic layers at interfaces with the non-magnetic layer, and
   a composition of at least one of the ferromagnetic layers in a range of 6 nm from the interface with the non-magnetic layer is expressed by $(M_{x'}O_{y'})_{1-z'}Z_{z'}$ where Z is at least one element selected from the group consisting of Ru, Os, Rh, Ir, Pd, Pt, Cu, Ag, and Au, M is at least one element selected from the group consisting of elements other than Z and O and includes a ferromagnetic metal, and x', y', and z' satisfy $0 < y'/x' < 1.33$, $0 < x'$, $0 < y'$, and $0 < z' \leq 0.4$.

3. The magnetoresistive element according to claim 2, wherein the composition of at least one of the ferromagnetic layers in a range of 2 nm from the interface with the non-magnetic layer is expressed by $(M_{x'}O_{y'})_{1-z'}Z_{z'}$.

4. The magnetoresistive element according to claim 1, wherein M includes Fe.

5. The magnetoresistive element according to claim 2, wherein M includes Fe.

6. The magnetoresistive element according to claim 4, wherein M is expressed by $Fe_aX^1_bX^2_c$ where $X^1$ is at least one element selected from the group consisting of Co, Ni, Mn, Tc, Re, Zn, Cd, Hg, Be, Mg, Ca, Sr, Ba, and Ra, $X^2$ is at least one element selected from the group consisting of Li, Na, K, Rb, Cs, and Fr, and a, b, and c satisfy $a+b+c=1$, $0.4 < a \leq 1$, $0 \leq b/a < 0.5$, $0 \leq c/a \leq 0.25$, and $0 \leq (b+2c)/a < 0.5$.

7. The magnetoresistive element according to claim 6, wherein a satisfies $a > 0.5$.

8. The magnetoresistive element according to claim 5, wherein M is expressed by $Fe_aX^1_bX^2_c$ where $X^1$ is at least one element selected from the group consisting of Co, Ni, Mn, Tc, Re, Zn, Cd, Hg, Be, Mg, Ca, Sr, Ba, and Ra, $X^2$ is at least one element selected from the group consisting of Li, Na, K, Rb, Cs, and Fr, and a, b, and c satisfy $a+b+c=1$, $0.4 < a \leq 1$, $0 \leq b/a \leq 0.5$, $0 \leq c/a \leq 0.25$, and $0 \leq (b+2c)/a < 0.5$.

9. The magnetoresistive element according to claim 3, wherein the non-magnetic layer is made of an insulating material.

10. The magnetoresistive element according to claim 2, wherein the non-magnetic layer is made of an insulating material.

* * * * *

UNITED STATES PATENT AND TRADEMARK OFFICE
CERTIFICATE OF CORRECTION

PATENT NO. : 6,861,940 B2
APPLICATION NO. : 10/732053
DATED : March 1, 2005
INVENTOR(S) : Matsukawa et al.

It is certified that error appears in the above-identified patent and that said Letters Patent is hereby corrected as shown below:

Column 38, line 58(claim 9): "according to claim 3" should read --according to claim 1--.

Signed and Sealed this

Twenty-sixth Day of June, 2007

JON W. DUDAS
*Director of the United States Patent and Trademark Office*